(12) United States Patent
Kamimura

(10) Patent No.: US 11,192,786 B2
(45) Date of Patent: Dec. 7, 2021

(54) COMPOSITION, COMPOSITION RESERVOIR, AND METHOD FOR PRODUCING COMPOSITION

(71) Applicant: FUJIFILM Corporation, Tokyo (JP)

(72) Inventor: Tetsuya Kamimura, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 16/170,638

(22) Filed: Oct. 25, 2018

(65) Prior Publication Data

US 2019/0062159 A1 Feb. 28, 2019

Related U.S. Application Data

(63) Continuation of application No. PCT/JP2017/016580, filed on Apr. 26, 2017.

(30) Foreign Application Priority Data

Apr. 28, 2016 (JP) .............................. JP2016-092072
Apr. 26, 2017 (JP) .............................. JP2017-086894

(51) Int. Cl.
*C01B 15/023* (2006.01)
*C11D 7/04* (2006.01)
(Continued)

(52) U.S. Cl.
CPC .......... *C01B 15/023* (2013.01); *C11D 3/3947* (2013.01); *C11D 7/02* (2013.01);
(Continued)

(58) Field of Classification Search
CPC ..... C01B 15/023; C11D 7/04; C11D 11/0047; C11D 17/0008; C11D 17/04; H01L 21/02057; C01P 2006/80
See application file for complete search history.

(56) References Cited

U.S. PATENT DOCUMENTS

| 5,705,089 A | 1/1998 | Sugihara et al. |
| 2006/0025320 A1* | 2/2006 | Borner ................. C11D 3/3947 510/175 |

(Continued)

FOREIGN PATENT DOCUMENTS

| CN | 102485642 A | 6/2012 |
| JP | 05259140 A | 10/1993 |

(Continued)

OTHER PUBLICATIONS

Jose M. Campos-Martin, Gema Blanco-Brieva, and Jose L. G. Fierro, Hydrogen Peroxide Synthesis: An Outlook beyond the Anthraquinone Process, Angew. Chem. Int. Ed. 2006, 45, 6962-6984. (Year: 2006).*

(Continued)

*Primary Examiner* — Bijan Ahvazi
(74) *Attorney, Agent, or Firm* — Sughrue Mion, PLLC

(57) ABSTRACT

A composition including hydrogen peroxide is provided, which can be used for semiconductor device manufacturing and which exhibits an excellent storage stability and has a reduced effect of defects on a semiconductor substrate. Further, a method is provided for producing the composition including hydrogen peroxide, and a composition reservoir for storing the composition. The composition includes hydrogen peroxide, an acid, and an Fe component, in which the content of the Fe component is $10^{-5}$ to $10^2$ in terms of mass ratio with respect to the content of the acid.

25 Claims, 1 Drawing Sheet

(51) Int. Cl.
  *C11D 11/00* (2006.01)
  *C11D 17/00* (2006.01)
  *C11D 17/04* (2006.01)
  *H01L 21/311* (2006.01)
  *C11D 7/02* (2006.01)
  *C11D 3/39* (2006.01)
  *C11D 7/26* (2006.01)
  *C11D 7/08* (2006.01)
  *H01L 21/02* (2006.01)

(52) U.S. Cl.
  CPC .................. *C11D 7/04* (2013.01); *C11D 7/08* (2013.01); *C11D 7/264* (2013.01); *C11D 11/0047* (2013.01); *C11D 17/0008* (2013.01); *C11D 17/04* (2013.01); *H01L 21/31133* (2013.01); *C01P 2006/80* (2013.01); *H01L 21/02057* (2013.01)

(56) References Cited

U.S. PATENT DOCUMENTS

2009/0175760 A1   7/2009   Minamikawa et al.
2012/0141357 A1*  6/2012   Zhan .................... B01D 61/025
                                                       423/584
2012/0258576 A1* 10/2012   Kanno ............ H01L 21/823418
                                                       438/231

FOREIGN PATENT DOCUMENTS

| JP | 2005260213 A | 9/2005 | |
| JP | 2006505132 A | 2/2006 | |
| JP | 2014-108903 A | 6/2014 | |
| KR | 1020080016808 A | 2/2008 | |
| WO | 2004041989 A1 | 5/2004 | |
| WO | 2015049327 A1 | 4/2015 | |
| WO | WO-2015049327 A1 * | 4/2015 | ........... C07D 303/04 |

OTHER PUBLICATIONS

Communication dated Oct. 15, 2019 from the Japanese Patent Office in application No. 2018-514670.
Communication dated Oct. 18, 2019 from the Korean Intellectual Property Office in counterpart application No. 10-2018-7030546.
International Search Report of PCT/JP2017/016580 dated Jul. 4, 2017.
International Preliminary Report on Patentability with English translation of the Written Opinion of PCT/JP2017/016580 dated Oct. 30, 2018.
Written Opinion of PCT/JP2017/016580 dated Jul. 4, 2017.
Office Action dated Jul. 24, 2020, from the Intellectual Property Office of Taiwan in Taiwan English Application No. 106114031.

* cited by examiner

COMPOSITION, COMPOSITION RESERVOIR, AND METHOD FOR PRODUCING COMPOSITION

CROSS-REFERENCE TO RELATED APPLICATIONS

This application is a Continuation of PCT International Application No. PCT/JP2017/016580 filed on Apr. 26, 2017, which claims priority under 35 U.S.C. § 119(a) to Japanese Patent Application No. 2016-092072 filed on Apr. 28, 2016 and Japanese Patent Application No. 2017-86894 filed on Apr. 26, 2017. Each of the above applications is hereby expressly incorporated by reference, in its entirety, into the present application.

BACKGROUND OF THE INVENTION

1. Field of the Invention

The present invention relates to a composition containing hydrogen peroxide, a method for producing the same, and a composition reservoir.

2. Description of the Related Art

The semiconductor device manufacturing process includes various steps such as a cleaning step of a semiconductor silicon wafer, a lithography step, an etching step, an ion implantation step, and a peeling step. In this case, it is general to include a step of treating unnecessary organic substances and inorganic substances with a treatment liquid after completion of each step or before going to the next step.

As such a treatment liquid, a treatment liquid containing hydrogen peroxide is sometimes used.

Generally, hydrogen peroxide is synthesized by a so-called anthraquinone method using an anthraquinone compound as a raw material (see, for example, JP2014-108903A).

Meanwhile, the treatment liquid used in the semiconductor device manufacturing process is required to have a high purity. The term "high purity" as used herein means that each concentration of a metal component or particles contained as impurities is low.

In the case where impurities of a metal component (for example, metal ions or metal particles) are incorporated in the treatment liquid, a phenomenon called migration occurs in which the metal diffuses into the target material during processing. The migration hinders the transmission of electric signals and causes defects such as short circuit. Also, in addition to that, metallic impurities become coarse particles with the metal itself serving as a nucleus and may remain as a residue on the semiconductor substrate after processing. The residue deteriorates the lithographic performance and causes defects, which may therefore adversely affect the formation of fine resist patterns or semiconductor elements.

SUMMARY OF THE INVENTION

The present inventors have examined the applicability of the hydrogen peroxide water manufactured by an anthraquinone method as described in JP2014-108903A to the manufacture of semiconductor devices and found that there is room to improve the storage stability of the hydrogen peroxide water. As a cause of the low storage stability, it is considered that the Fe component incorporated from the solvent or from the raw material or the like catalytically reacts in the acidic region to result in radicalization of the hydrogen peroxide into hydroxyl radicals (so-called Fenton reaction), and as a result, hydrogen peroxide is decomposed.

On the other hand, it is known that the Fenton reaction is suppressed in the case where the Fe component is used as a metal adsorbent using a metal adsorbent such as an acid (for example, a chelate complex in the case where the acid has a polydentate structure). The present inventors have made an attempt to improve the storage stability of the hydrogen peroxide water using the Fe component and the acid as the metal adsorbent. As a result, the present inventors have found that hydrogen peroxide water may not satisfy the high purity required for semiconductor device manufacturing applications, in the case where the amount of the Fe component is too small relative to that of the acid. That is, the present inventors have learned that, in the case where a semiconductor substrate is cleaned using the hydrogen peroxide water, the number of particles (also referred to as "the number of defects") adhering to the semiconductor substrate increases, and there are cases where such hydrogen peroxide water cannot be applied to the semiconductor device manufacturing process. In particular, this problem becomes more prominent as the degree of integration and miniaturization (for example, 30 nm node or less) of semiconductor devices increases. Further, in recent years, manufacture of semiconductor devices of 10 nm node or less has also been studied, but this problem is becoming more prominent.

Therefore, an object of the present invention is to provide a composition including hydrogen peroxide, which can be used for semiconductor device manufacturing and which exhibits an excellent storage stability and has a reduced effect of defects on a semiconductor substrate.

Another object of the present invention is to provide a method for producing the composition including hydrogen peroxide, and a composition reservoir for storing the composition.

As a result of extensive studies to achieve the foregoing objects, the present inventors have found that those objects can be achieved by a composition which contains hydrogen peroxide and in which a Fe component and an acid as a metal adsorbent are controlled to a specific ratio. The present invention has been completed based on these findings.

That is, the present inventors have found that the foregoing objects can be achieved by the following configurations.

(1) A composition, comprising: hydrogen peroxide; an acid; and a Fe component, in which the content of the Fe component is $10^{-5}$ to $10^2$ in terms of mass ratio with respect to the content of the acid.

(2) The composition according to (1), further comprising an anthraquinone compound.

(3) The composition according to (1) or (2), in which the content of the anthraquinone compound is 0.01 ppb by mass to 1000 ppb by mass with respect to the total mass of the composition.

(4) The composition according to any one of (1) to (3), in which the content of the acid is 0.01 ppb by mass to 1000 ppb by mass with respect to the total mass of the composition.

(5) The composition according to any one of (1) to (4), in which the total content of the Fe component is 0.1 ppt by mass to 1 ppb by mass with respect to the total mass of the composition.

(6) The composition according to any one of (1) to (5), in which the content of Fe particles contained in the Fe component is 0.01 ppt by mass to 0.1 ppb by mass with respect to the total mass of the composition.

(7) The composition according to any one of (1) to (6), further comprising: at least one or more metal components containing a specific atom selected from the group consisting of Ni, Pt, Pd, Cr, Ti, and Al, in which the content of the metal component is 0.01 ppt by mass to 10 ppb by mass with respect to the total mass of the composition for each specific atom.

(8) The composition according to any one of (1) to (6), further comprising: at least one or more metal components containing a specific atom selected from the group consisting of Ni, Pt, Pd, and Al,
  in which the content of the metal component is 0.01 ppt by mass to 1 ppb by mass with respect to the total mass of the composition.

(9) The composition according to any one of (2) to (8), in which the anthraquinone compound is at least one or more selected from the group consisting of alkyl anthraquinone and alkyl tetrahydroanthraquinone.

(10) The composition according to (9), in which the alkyl anthraquinone is ethyl anthraquinone or amyl anthraquinone, and the alkyl tetrahydroanthraquinone is ethyl tetrahydroanthraquinone or amyl tetrahydroanthraquinone.

(11) The composition according to any one of (1) to (10), in which the acid is one selected from the group consisting of phosphoric acid and a phosphoric acid derivative.

(12) The composition according to any one of (1) to (11), which is used as a treatment liquid for a semiconductor substrate.

(13) A composition reservoir, comprising: a storage container; and the composition according to any one of (1) to (12) contained in the storage container, in which a region of the storage container in contact with the composition is formed of a material containing nonmetal as a main component.

(14) The composition reservoir according to (13), in which the material containing nonmetal as a main component is any one selected from the group consisting of high density polyethylene, tetrafluoroethylene-perfluoroalkyl vinyl ether copolymer, and polytetrafluoroethylene.

(15) The composition reservoir according to (13) or (14), in which a contact angle between the material containing nonmetal as a main component and water is 60 to 120°.

(16) A method for producing the composition according to any one of (1) to (12), comprising:
  a raw material purification step of purifying any one or more selected from a solvent and a raw material component including an anthraquinone compound;
  a hydrogen peroxide synthesis step of reducing the anthraquinone compound in the presence of a catalyst to synthesize an anthrahydroquinone compound and oxidizing the anthrahydroquinone compound to synthesize hydrogen peroxide;
  a hydrogen peroxide separation step of extracting the obtained hydrogen peroxide to take out the hydrogen peroxide from a reaction system; and
  a hydrogen peroxide composition purification step of further purifying a hydrogen peroxide composition containing the hydrogen peroxide separated from the reaction system.

According to the present invention, there is provided a composition including hydrogen peroxide, which can be used for semiconductor device manufacturing and which exhibits an excellent storage stability and has a reduced effect of defects on a semiconductor substrate.

Further, according to the present invention, there are provided a method for producing the composition including hydrogen peroxide; and a composition reservoir for storing the composition.

Further, according to the present invention, there are provided a treatment liquid which can reduce the occurrence of defects particularly even in the formation of a semiconductor device of an ultrafine pattern (for example, a 10 nm node or less) in recent years and therefore exhibits an excellent storage stability; and a reservoir for containing the composition.

DESCRIPTION OF THE PREFERRED EMBODIMENTS

Figure 1:
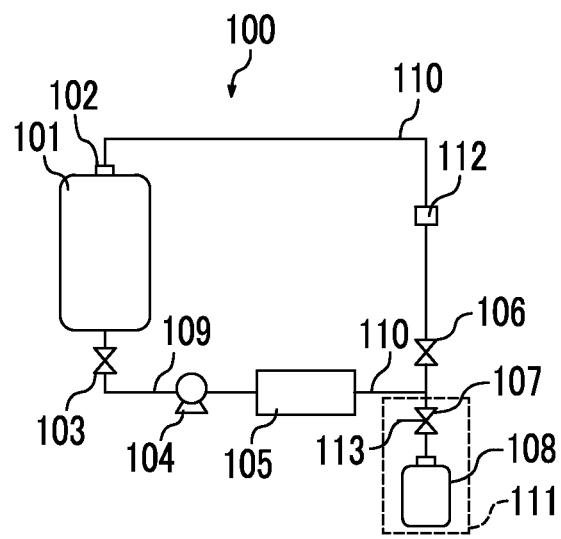
FIG. 1 is a schematic diagram showing one embodiment of a purification apparatus that can be used in the method for producing a composition of the present invention.

Hereinafter, the present invention will be described in detail.

Descriptions of the constituent elements described below are sometimes made based on representative embodiments of the present invention, but the present invention is not limited to such embodiments.

In the present specification, the numerical range expressed by using "to" means a range including numerical values described before and after "to" as a lower limit value and an upper limit value, respectively.

In the notation of the group (atomic group) in the present specification, notation not describing substitution and non-substitution also includes those having a substituent as well as those having no substituent as long as the effect of the present invention is not impaired. For example, the term "alkyl group" includes not only an alkyl group having no substituent (unsubstituted alkyl group) but also an alkyl group having a substituent (substituted alkyl group). This also has the same meaning for each compound.

In addition, in the present specification, "preparation" is meant to include preparing a specific material by synthesis or combination, and procuring a predetermined material by purchase or the like.

In the present specification, the term "ppm" means "parts-per-million (10-6)", the term "ppb" means "parts-per-billion (10-9)", and "ppt" means "parts-per-trillion(10-12)".

Further, in the present specification, the term "semiconductor substrate" is not particularly limited as long as it is a substrate used for semiconductor device manufacturing, and examples thereof include a silicon substrate (Si substrate), a silicon oxide film substrate (SiO substrate), and a silicon nitride substrate (SiN substrate). Also, the substrate may include not only a wafer but an entire substrate structure in which a circuit structure is applied on the wafer.

[Composition]

The composition of the present invention includes hydrogen peroxide, an acid, and a Fe component, with the content of the Fe component being 10-5 to 102 in terms of mass ratio with respect to the content of the acid.

By adopting the above configuration, the composition of the present invention is excellent in storage stability and has a reduced effect of defects on a semiconductor substrate in the case of being applied to a semiconductor device manufacturing process. That is, the composition of the present invention has a small decomposition rate of hydrogen peroxide even after storage over time. Further, for example, in the case where the composition of the present invention is applied as a treatment liquid to a semiconductor device manufacturing process, it is possible to suppress a decrease in the yield of the semiconductor substrate since the adhesion of particles to the semiconductor substrate to be treated is small (in other words, the number of defects is small).

Although this is not clear in detail, it is presumed as follows.

It is desirable that the composition of the present invention is one which is purified by removing trace amounts of impurities such as organic contaminants, metal contaminants, fats and oils contained in the liquid by filtration, ion exchange, or the like, so that the composition is applicable to the semiconductor device manufacturing process. Although the composition of the present invention is excessively subjected to this removal purification during the preparation thereof, it is characterized in that the impurities are not completely removed but at least a small amount of the Fe component is left to remain. Incidentally, it is considered that the Fe component is present in a certain amount in a solvent or a raw material component including anthraquinone, and is incorporated into the composition through the solvent or raw material. In the present specification, the Fe component includes those in which the Fe atoms are in the ionic state and those in which the Fe atoms are in the non-ionic state. For example, the form of Fe ions and Fe metal particles (Fe particles) is included. That is, the Fe component means all the components (Fe ions and Fe particles) derived from the Fe atoms contained in the composition, and the content of the Fe component means a total metal amount (total Fe atom amount).

In the process of preparing the composition of the present invention, the Fe component may be purified and removed to less than the lower limit of the predetermined numerical range, and then the Fe component may be added in a predetermined numerical range.

The impurity removal and purification described above may be carried out on a solvent or a raw material component used in the process of synthesizing hydrogen peroxide, and may be carried out on a composition containing hydrogen peroxide after synthesis of hydrogen peroxide.

As mentioned above, the acid in the composition of the present invention is considered to also function as a metal adsorbent. Although the Fe component decomposes hydrogen peroxide particularly in the acidic region by the Fenton reaction (a higher pH leads to a higher decomposition rate), it becomes possible to suppress the Fenton reaction as the acid serving as a metal adsorbent complexes the Fe component. In the case where the content of the Fe component is greater than $10^2$ in terms of mass ratio with respect to the content of the acid, it becomes difficult to suppress the Fenton reaction and therefore the storage stability of the composition becomes insufficient. On the other hand, in the case where the content of the Fe component is less than $10^{-5}$ in terms of mass ratio with respect to the content of the acid, colloidal particles are formed in the liquid, which causes an increase in the number of defects adhering onto the semiconductor substrate. In the case where the content of the Fe component in the composition is $10^{-5}$ to $10^2$ in terms of mass ratio with respect to the content of the acid, the composition exhibits an excellent storage stability and in the case of being applied to a semiconductor device manufacturing process, the composition has a reduced effect of defects on the semiconductor substrate.

In addition, the total content of the Fe component in the composition of the present invention is preferably 0.1 ppt by mass to 1 ppb by mass with respect to the total mass of the composition. By setting the total content of the Fe component contained in the composition within the above range, the effect of the present invention is even more excellent. Although the reason for this is not clear, in the case where the total content of the Fe component is in the low concentration region, it is speculated that most of the Fe component is usually dispersed as hydroxide colloid condensed with a hydrate of Fe as long as it does not form readily soluble complex ions. In the case where the total content of the Fe component is 0.1 ppt by mass or more, the effect as a positive colloid is weak and it becomes difficult to adsorb onto an oxide film having a negative zeta potential slightly higher than that of the silicon surface, so that the effect of defects on the semiconductor substrate hardly appears.

Further, it is also confirmed that the oxidizing power of the composition is excellent in the case where the total content of the Fe component is 0.1 ppt by mass or more with respect to the total mass of the composition. Although the reason for this is not clear, it is considered that the amount of the hydroxyl radical, which is a reactive species, exists in an appropriate amount in the system, in the case where the total content of the Fe component is 0.1 ppt by mass or more with respect to the total mass of the composition. In other words, in the case where the total content of the Fe component is less than 0.1 ppt by mass with respect to the total mass of the composition, there is a tendency that the amount of the hydroxyl radical, which is a reactive species, is too small in the system and therefore the oxidizing power becomes smaller.

On the other hand, in the case where the total content of the Fe component is 1 ppb by mass or less with respect to the total mass of the composition, the Fe component does not become particles, so that defects to the semiconductor substrate do not increase in the case of being applied to a semiconductor device manufacturing process.

The content of the acid in the composition of the present invention is preferably 0.01 ppb by mass to 1000 ppb by mass with respect to the total mass of the composition. In the case where the content of the acid is less than 0.01 ppb by mass with respect to the total mass of the composition, the content of the Fe component in the composition may be relatively excessive in some cases. In the case where the content of the acid is 0.01 ppb by mass or more with respect to the total mass of the composition, the content of the Fe component is adjusted to an appropriate range, so that storage stability is superior, or the Fe component does not serve as a nucleus to form particles in the liquid, and defects on a semiconductor substrate can be reduced in the case of being applied to a semiconductor device manufacturing process.

On the other hand, in the case where the content of the acid is greater than 1000 ppb by mass with respect to the total mass of the composition, the content of the Fe component in the composition may become relatively too small in some cases. In the case where the content of the acid is 1000 ppb by mass or less with respect to the total mass of the composition, it is difficult for colloidal particles to be formed in the liquid, and defects on the semiconductor substrate can be reduced in the case of being applied to a semiconductor device manufacturing process.

Hydrogen peroxide is usually synthesized by an anthraquinone method. In a composition containing hydrogen peroxide synthesized by an anthraquinone method, impurities derived from a raw material (for example, a metal component containing an atom selected from the group consisting of Ni, Pt, Pd, and Al derived from an anthraquinone compound or a catalyst that can be used in the step of reducing anthraquinone to synthesize anthrahydroquinone) often remain in a trace amount but to a certain extent. Although it is desired that these impurities are removed normally, in the present invention, it is preferable not to completely remove them, but to remain at least a small amount thereof in the composition.

In the composition of the present invention, the content of the anthraquinone compound is preferably 0.01 ppb by mass to 1000 ppb by mass with respect to the total mass of the composition. In the case where the content of the anthraquinone compound is 0.01 ppb by mass or more with respect to the total mass of the composition, it is effective for improving defect performance. On the other hand, in the case where the content of the anthraquinone compound is 1000 ppb by mass or less with respect to the total mass of the composition, the effect of defects on the semiconductor substrate is small in the case of being applied to a semiconductor device manufacturing process.

In addition, the composition of the present invention may contain a metal component containing an atom selected from the group consisting of Ni, Pt, Pd, Cr, Ti, and Al (hereinafter, also referred to as "specific atom").

The content of the metal component is preferably 0.01 ppt by mass to 10 ppb by mass with respect to the total mass of the composition for each specific atom.

Here, the metal component includes those in which the specific atom is in the ionic state and those in which the specific atom is in the non-ionic state, examples of which include forms of specific metal ions and specific metal particles (non-ionic metal). That is, in the case where the composition of the present invention contains, for example, only the Pt component, the Pt component includes all Pt atom-derived components (Pt ions and Pt particles) contained in the composition, and the content of the Pt component means a total metal amount of Pt (total Pt atom amount) (the total metal amount is as described above). Further, the phrase "the content of the metal component is 0.01 ppt by mass to 10 ppb by mass with respect to the total mass of the composition for each specific atom" means that, in the case where the composition of the present invention contains, for example, two kinds of Pt component and Ni component, the content of each specific atom (in other words, both the content of the Pt component and the content of the Ni component) is 0.01 ppt by mass to 10 ppb by mass with respect to the total mass of the composition.

In the case where the content of the metal component containing a specific atom selected from the group consisting of Ni, Pt, Pd, Cr, Ti, and Al is 0.01 ppb by mass or more with respect to the total mass of the composition for each specific atom, the oxidizing power of the composition is superior. On the other hand, in the case where the content of the metal component containing a specific atom selected from the group consisting of Ni, Pt, Pd, Cr, Ti, and Al is 1000 ppb by mass or less (preferably 10 ppb by mass or less) with respect to the total mass of the composition for each specific atom, the effect of defects on the semiconductor substrate is small in the case of being applied to a semiconductor device manufacturing process.

In the composition containing hydrogen peroxide synthesized by an anthraquinone method, as described above, a large amount of metal components containing Ni atoms, Pt atoms, Pd atoms and/or Al atoms derived from the catalyst that can be used in the step of reducing anthraquinone to synthesize anthrahydroquinone may be contained. In addition, metal components derived from raw material components other than the above metal components are also often incorporated. It was confirmed that the above-mentioned effects can be obtained by setting the content of the metal component containing an atom selected from the group consisting of particularly Ni, Pt, Pd, Cr, Ti, and Al, among these metal components, within the above range.

In addition, in the composition of the present invention, the content of the metal component containing an atom selected from the group consisting of Ni, Pt, Pd, and Al (hereinafter, also referred to as "specific atom") is preferably 0.01 ppt by mass to 1 ppb by mass with respect to the total mass of the composition. Here, the metal component includes those in which the specific atom is in the ionic state and those in which the specific atom is in the non-ionic state, examples of which include forms of specific metal ions and specific metal particles (non-ionic metal). That is, in the case where the composition of the present invention contains, for example, only the Pt component, the Pt component includes all Pt atom-derived components (Pt ions and Pt particles) contained in the composition, and the content of the Pt component means a total metal amount of Pt (total Pt atom amount) (the total metal amount is as described above). In the case where the content of the metal component containing a specific atom selected from the group consisting of Ni, Pt, Pd, and Al is 0.01 ppb by mass or more with respect to the total mass of the composition, the oxidizing power of the composition is superior. On the other hand, in the case where the content of the metal component containing a specific atom selected from the group consisting of Ni, Pt, Pd, and Al is 1000 ppb by mass or less (preferably 1 ppb by mass or less) with respect to the total mass of the composition, the effect of defects on the semiconductor substrate is small in the case of being applied to a semiconductor device manufacturing process. In the composition containing hydrogen peroxide synthesized by an anthraquinone method, as described above, a large amount of metal components containing Ni atoms, Pt atoms, Pd atoms and/or Al atoms derived from the catalyst that can be used in the step of reducing anthraquinone to synthesize anthrahydroquinone may be contained. It was confirmed that the above-mentioned effects can be obtained by setting the content of the metal component containing an atom selected from the group consisting of Ni, Pt, Pd, and Al within the above range.

Hereinafter, individual components in the composition of the present invention will be described in more detail.

<Hydrogen Peroxide>

The content of hydrogen peroxide in the composition of the present invention is preferably 0.001% to 70% by mass, more preferably 10% to 60% by mass, and still more preferably 15% to 60% by mass.

<Acid>

The composition of the present invention contains an acid. Note that hydrogen peroxide is not included in the "acid" as used herein.

The acid is not particularly limited as long as it can adsorb metal ions present in the liquid (the form of adsorption may be, for example, an ionic bond or a coordinate bond), but it is preferably a water-soluble acidic compound.

The water-soluble acidic compound is not particularly limited as long as it is a compound having a dissociable functional group which is acidic in the case of being dissolved in water, which may be an organic compound or an inorganic compound. The term "water-soluble" as used herein means to dissolve 5 g or more of the compound in 100 g of water at 25° C.

Examples of the water-soluble acidic compound and a salt thereof include an acidic compound such as inorganic acid (for example, hydrochloric acid, sulfuric acid, phosphoric acid, or nitric acid), a carboxylic acid derivative, a sulfonic acid derivative, and a phosphoric acid derivative. In addition, the water-soluble acidic compound may be a compound in which these acidic functional groups form a salt.

Among them, the water-soluble acidic compound is preferably a phosphoric acid derivative or phosphoric acid from the viewpoint of effectively chelating and removing impurities.

Examples of the phosphoric acid derivative include pyrophosphoric acid and polyphosphoric acid.

Examples of the cation capable of forming a salt with the water-soluble acidic compound include an alkali metal, an alkaline earth metal, a quaternary alkyl compound (for example, tetramethylammonium hydroxide (TMAH), tetraethylammonium hydroxide (TEAH), tetrapropylammonium hydroxide (TPAH), and tetrabutylammonium hydroxide (TBAH). The salt-forming cations may be used alone or in combination of two or more thereof.

As the water-soluble acidic compound, a so-called chelating agent may be used in addition to the above-mentioned compounds. The chelating agent is not particularly limited, but it is preferably polyaminopolycarboxylic acid.

The polyaminopolycarboxylic acid is a compound having a plurality of amino groups and a plurality of carboxylic acid groups, and examples thereof include mono- or polyalkylene polyamine polycarboxylic acid, polyaminoalkane polycarboxylic acid, polyaminoalkanol polycarboxylic acid, and hydroxyalkyl ether polyamine polycarboxylic acid.

Suitable examples of the polyaminopolycarboxylic acid chelating agent include butylene diamine tetraacetic acid, diethylenetriamine pentaacetic acid (DTPA), ethylenediamine tetrapropionic acid, triethylenetetramine hexacetic acid, 1,3-diamino-2-hydroxypropane-N,N,N',N'-tetraacetic acid, propylenediamine tetraacetic acid, ethylenediamine tetraacetic acid (EDTA), trans-1,2-diaminocyclohexane tetraacetic acid, ethylenediamine diacetic acid, ethylenediamine dipropionic acid, 1,6-hexamethylene-diamine-N,N,N',N'-tetraacetic acid, N,N-bis(2-hydroxybenzyl)ethylenediamine-N,N-diacetic acid, diaminopropane tetraacetic acid, 1,4,7,10-tetraazacyclododecane tetraacetic acid, diaminopropanol tetraacetic acid, and (hydroxyethyl)ethylenediamine triacetic acid. Among them, diethylenetriamine pentaacetic acid (DTPA), ethylenediamine tetraacetic acid (EDTA), or trans-1,2-diaminocyclohexane tetraacetic acid is preferable.

In the composition of the present invention, the acids may be used alone or in combination of two or more thereof.

As described above, the content of the acid is preferably 0.01 ppb by mass to 1000 ppb by mass with respect to the total mass of the composition. From the viewpoint of further improving the effect of the present invention, the content of the acid is more preferably 0.05 ppb by mass to 800 ppb by mass and still more preferably 0.05 ppb by mass to 500 ppb by mass.

<Fe Component>

The composition of the present invention contains a Fe component.

As described above, the content of the Fe component in the composition of the present invention is $10^{-5}$ to $10^2$ in terms of mass ratio with respect to the content of the acid. From the viewpoint of further improving the effect of the present invention, the content of the Fe component is preferably $10^{-3}$ to $10^{-1}$ in terms of mass ratio with respect to the content of the acid.

Further, as described above, the content of the Fe component in the composition of the present invention is preferably 0.1 ppt by mass to 1 ppb by mass with respect to the total mass of the composition. The content of the Fe component is more preferably 0.1 ppt by mass to 800 ppt by mass and still more preferably 0.1 ppt by mass to 500 ppt by mass, from the viewpoint of further improving the effect of the present invention. The content here is intended to refer to the total metal amount of Fe atoms.

<Water>

The composition of the present invention may contain water as a solvent.

The content of water is not particularly limited, but it may be 1% to 99.999% by mass with respect to the total mass of the composition.

The water is preferably ultrapure water used for semiconductor device manufacturing.

In particular, the water is preferably water with a reduced amount of inorganic anions, metal ions, and the like, among which the water is more preferably one in which the concentration of ions derived from the metal atom of Fe, Co, Na, K, Ca, Cu, Mg, Mn, Li, Al, Cr, Ni, and Zn is reduced and still more preferably one in which the metal ion content is adjusted to ppt level or lower (in one embodiment, the metal content is less than 0.001 ppt by mass) in the case of being used for preparing the composition of the present invention. The method of adjustment is preferably purification using a filtration membrane or ion-exchange membrane, or purification by distillation. Examples of the method of adjustment include a method described in paragraphs [0074] to [0084] of JP2011-110515A, and a method described in JP2007-254168 A.

In addition, the water used in the embodiment of the present invention is preferably water obtained as described above. In the case where the composition of the present invention is used as a treatment liquid for semiconductor manufacturing, from the viewpoint that the desired effect of the present invention can be significantly obtained, it is more preferred that the above-mentioned water is used for the composition of the present invention as well as for cleaning the reservoir container and for preparing a liquid of a kit which will be described later. In addition, it is preferred that the water described above is also used for the production process of the composition of the present invention, the measurement of the components of the composition of the present invention, and the measurement for the evaluation of the composition of the present invention.

<Anthraquinone Compound>

The composition of the present invention may contain an anthraquinone compound.

Examples of the anthraquinone compound include those used in the process of synthesizing hydrogen peroxide by an anthraquinone method. Specifically, the anthraquinone compound is preferably at least one or more selected from the group consisting of alkyl anthraquinone and alkyl tetrahydroanthraquinone.

The alkyl group contained in the alkyl anthraquinone and alkyl tetrahydroanthraquinone is, for example, preferably an alkyl group having 1 to 8 carbon atoms and more preferably an alkyl group having 1 to 5 carbon atoms. Among them, the alkyl anthraquinone is preferably ethyl anthraquinone or amyl anthraquinone. Among them, the alkyl tetrahydroanthraquinone is preferably ethyl tetrahydroanthraquinone or amyl tetrahydroanthraquinone.

In the composition of the present invention, the anthraquinone compounds may be used alone or in combination of two or more thereof.

In the case where the composition of the present invention contains an anthraquinone compound, the content thereof is preferably 0.01 ppb by mass to 1000 ppb by mass with respect to the total mass of the composition as described above. From the viewpoint of further improving the effect of the present invention, the content of the anthraquinone compound is more preferably 0.05 ppb by mass to 800 ppb by mass and still more preferably 0.05 ppb by mass to 500 ppb by mass.

<Metal Component Containing Specific Atom Selected from Group Consisting of Ni, Pt, Pd, Cr, Ti, and Al>

The composition of the present invention may contain at least one or more metal components containing a specific atom selected from the group consisting of Ni, Pt, Pd, Cr, Ti, and Al.

In the case where the composition of the present invention contains a metal component containing a specific atom selected from the group consisting of Ni, Pt, Pd, Cr, Ti, and Al, the content of the metal component is, as described above, preferably 0.01 ppt by mass to 10 ppb by mass with respect to the total mass of the composition for each specific atom. From the viewpoint of further improving the effect of the present invention, the content of the metal component is more preferably 0.01 ppt by mass to 1 ppb by mass, still more preferably 0.01 ppt by mass to 800 ppt by mass, and particularly preferably 0.01 ppt by mass to 500 ppt by mass.

<Metal Component Containing Specific Atom Selected from Group Consisting of Ni, Pt, Pd, and Al>

The composition of the present invention may contain at least one or more metal components containing a specific atom selected from the group consisting of Ni, Pt, Pd, and Al.

In the case where the composition of the present invention contains a metal component containing a specific atom selected from the group consisting of Ni, Pt, Pd, and Al, the content thereof is, as described above, preferably 0.01 ppt by mass to 1 ppb by mass with respect to the total mass of the composition. From the viewpoint of further improving the effect of the present invention, the content of the metal component is more preferably 0.01 ppt by mass to 800 ppt by mass and still more preferably 0.01 ppt by mass to 500 ppt by mass.

In addition to the above-described components, the composition of the present invention may contain other additives within a range that exerts the effects of the present invention. Examples of other additives include a surfactant, an antifoaming agent, a pH adjusting agent, and a fluoride.

[Method for Producing Composition]

The method for producing the composition of the present invention includes:

a raw material purification step of purifying any one or more selected from a solvent and a raw material component including an anthraquinone compound (hereinafter, also referred to as a "first step");

a hydrogen peroxide synthesis step of reducing the anthraquinone compound in the presence of a catalyst to synthesize an anthrahydroquinone compound and oxidizing the anthrahydroquinone compound to synthesize hydrogen peroxide (hereinafter, also referred to as a "second step");

a hydrogen peroxide separation step of extracting the obtained hydrogen peroxide to take out the hydrogen peroxide from a reaction system (hereinafter, also referred to as a "third step"); and a hydrogen peroxide composition purification step of further purifying a hydrogen peroxide composition containing the hydrogen peroxide separated from the reaction system (hereinafter, also referred to as a "fourth step").

Hereinafter, the first step to the fourth step will be described in detail.

(First Step: Raw Material Purification Step)

The method for producing the composition of the present invention is a method for synthesizing hydrogen peroxide using a so-called anthraquinone method using an anthraquinone compound as a raw material.

In this first step, any one or more selected from a solvent and a raw material component including an anthraquinone compound are purified by distillation, ion exchange, filtration, or the like in advance. As to a degree of purification, for example, it is preferable to purify until the purity of the raw material becomes 99% or more, and it is more preferable to purify until the purity becomes 99.9% or more. The use of such a high-purity raw material is important for obtaining the remarkable effect of the present invention.

The solvent referred to in the first step includes water used as an extraction solvent for hydrogen peroxide in the third step, or a solvent optionally used up to the end of the composition purification step, in addition to the solvent used in the synthesis reaction of hydrogen peroxide carried out in the second step.

In addition, the raw material component including the anthraquinone compound referred to in the first step includes a reduction catalyst of an anthraquinone compound, in addition to the above-mentioned anthraquinone compound such as alkyl anthraquinone and alkyl tetrahydroanthraquinone.

The purification method is not particularly limited, but examples thereof include a method of passing a target substance through an ion exchange resin, a reverse osmosis membrane (RO membrane), or the like, distillation, and a method such as filtering which will be described later. Specifically, for example, there is a method in which a liquid is passed through a reverse osmosis membrane or the like to carry out primary purification, and then the liquid is passed through a purification apparatus including a cation exchange resin, an anion exchange resin, or a mixed bed ion exchange resin to carry out secondary purification.

Further, the purification treatment may be carried out by combining a plurality of the above-mentioned known purification methods.

Further, the purification treatment may be carried out plural times.

(Second Step: Hydrogen Peroxide Synthesis Step)

In the second step, a known hydrogen peroxide synthesis method using an anthraquinone compound as a raw material can be applied. For example, a method described in JP2014-108903A can be mentioned.

(Third Step: Hydrogen Peroxide Separation Step)

This third step is a step of extracting and taking out the hydrogen peroxide obtained in the second step, and a known method for extracting hydrogen peroxide can be applied thereto. For example, a method described in JP2014-108903A can be mentioned.

In the case of carrying out the extraction, it is preferable to extract hydrogen peroxide with water.

The "Water" in the third step is preferably water in which the concentration of ions derived from metal atoms of Fe, Co, Na, K, Ca, Cu, Mg, Mn, Li, Al, Cr, Ni, and Zn is reduced through the raw material purification step which is the first step, and more preferably ion exchange water, or ultrapure water used for semiconductor device manufacturing.

(Fourth Step: Hydrogen Peroxide Composition Purification Step)

The fourth step is a step of purifying the hydrogen peroxide composition (hydrogen peroxide water) obtained in the third step.

The purification method is not particularly limited, and examples thereof include a method of passing a target substance through an ion exchange resin, and distillation of a target substance under reduced pressure.

As the method of passing a target substance through an ion exchange resin, for example, in addition to a method using an acidic cation exchange resin, a method using a mixed bed of an anion exchange resin and a cation exchange resin can be mentioned.

Further, filtering as described below may be carried out on the hydrogen peroxide water.

Further, the purification treatment may be carried out by combining a plurality of the above-mentioned known purification methods.

Further, the purification treatment may be carried out plural times.

<Filtering>

Any filter may be used without particular limitation as long as it is conventionally used for filtration or the like. For example, the filter may be a filter made of a fluororesin such as polytetrafluoroethylene (PTFE) or tetrafluoroethylene-perfluoroalkyl vinyl ether copolymer (PFA), a polyamide-based resin such as nylon, a polyolefin resin such as polyethylene or polypropylene (PP) (including ones having a high density and an ultra-high molecular weight), or the like. Among these materials, a material selected from the group consisting of polyethylene, polypropylene (including high-density polypropylene), a fluororesin such as PTFE or PTA, and a polyamide-based resin such as nylon is preferable, among which a filter made of polypropylene (including high-density polypropylene) or nylon is more preferable. By using a filter formed by these materials, it is possible to effectively remove highly polar foreign materials that are likely to cause defects (residue defects and particle defects) in the semiconductor substrate, and it is also possible to efficiently reduce the amount of the specific metal component of the present invention.

In one embodiment, the pore diameter of the filter is suitably about 0.001 to 1.0 µm, preferably about 0.02 to 0.5 µm, and more preferably about 0.01 to 0.1 µm. By specifying the pore diameter of the filter to be in this range, it becomes possible to reliably remove fine foreign materials such as impurities or aggregates contained in the material to be treated (a liquid to be filtered, for example, a solvent or a raw material component used in the first step, and hydrogen peroxide water obtained through the third step), while suppressing clogging of the filter.

For the use of filter, different filters may be used in combination.

In the case where different filters are used in combination, for example, a method using a first filter and a second filter can be mentioned. In that case, filtering by a first filter may be carried out only once or two or more times. In addition, first filters having a different pore diameter in the above-mentioned range may be used in combination. The pore diameter herein can be set by referring to nominal values of filter manufacturers. Commercially available filters can be selected from various filters supplied by, for example, Nihon Pall Ltd., Advantec Toyo Kaisha, Ltd., Nihon Entegris K.K. (formerly Nihon Mykrolis K.K.) or Kitz Micro Filter Corporation.

As the second filter, it is possible to use a filter formed of the same material or the like as the first filter. In one embodiment, the pore diameter of the second filter is suitably about 0.01 to 1.0 µm and preferably about 0.1 to 0.5 µm. By specifying the pore diameter of the filter to be in this range, in the case where component particles (for example, Fe particles which will be described later) are contained in the material to be treated, it is possible to remove foreign materials incorporated in the material to be treated while these component particles remains.

In addition, it is preferred that the filter to be used is treated prior to filtering the material to be treated. The liquid used for this treatment is not particularly limited, but it is preferred that the metal content in the liquid is less than 0.001 ppt by mass. In addition to the above-mentioned water, as long as the liquid used for this treatment is a liquid in which other organic solvents are purified so that the metal content is within the above range, or a composition itself of the present invention, a diluted composition of the present invention, or a liquid containing a compound added to the composition of the present invention, the desired effect of the present invention is significantly obtained.

Hereinafter, a purification apparatus equipped with a filter, which can be suitably used for purification of a material to be treated, will be described.

Purification Apparatus

FIG. 1 is a schematic diagram showing one embodiment of a purification apparatus. A purification apparatus 100 includes a tank 101, in which the tank 101 is provided with a supply port 102 for supplying a material to be treated. The purification apparatus 100 includes a filtration device 105, in which the tank 101 and the filtration device 105 are connected to each other through a supply pipe line 109 so that a fluid (material to be treated) can be transferred between the tank 101 and the filtration device 105. A valve 103 and a pump 104 are disposed in the supply pipe line 109. In FIG. 1, the purification apparatus 100 includes the tank 101 and the filtration device 105, but is not limited to this as a purification apparatus that can be used for filtering the material to be treated.

In the purification apparatus 100, the fluid supplied from the supply port 102 flows into the filtration device 105 through the valve 103 and the pump 104. The fluid discharged from the filtration device 105 is stored in the tank 101 through a circulation pipe line 110.

The purification apparatus 100 includes a discharge unit 111 for discharging the material to be treated to the circulation pipe line 110. The discharge unit 111 is provided with a valve 107 and a container 108, and is configured such that the material to be treated can be stored in the container 108 by switching of a valve 106 provided in a circulation pipe line, and the valve 107. Further, a switchable pipe line 113 is connected to the valve 107, and the material to be treated after the circulation cleaning can be discharged out of the purification apparatus 100 through the pipe line 113. In some cases, particles, metallic impurities, and the like are contained in the material to be treated after the circulation cleaning, and according to the purification apparatus 100 having the pipe line 113 for discharging the material to be treated to the outside of the apparatus, foreign materials easily causing the defect of the semiconductor substrate can be effectively removed without contamination of the filled portion or the like of the container 108.

Further, the purification apparatus 100 includes a material to be treated monitoring unit 112 in the circulation pipe line 110. In FIG. 1, the purification apparatus 100 includes the material to be treated monitoring unit 112 in the circulation pipe line 110, but the purification apparatus that can be used for filtering the material to be treated is not limited thereto. The material to be treated monitoring unit 112 may be provided in the supply pipe line 109, or may be provided in the supply pipe line 109 and the circulation pipe line 110. In the purification apparatus 100, the material to be treated monitoring unit 112 is provided directly in the circulation pipe line 110, but the purification apparatus that can be used for filtering the material to be treated is not limited thereto. The material to be treated monitoring unit may be provided in a temporary reservoir tank (which is different from the tank 101) of a fluid (not shown) provided in the pipe line.

Figure 2:
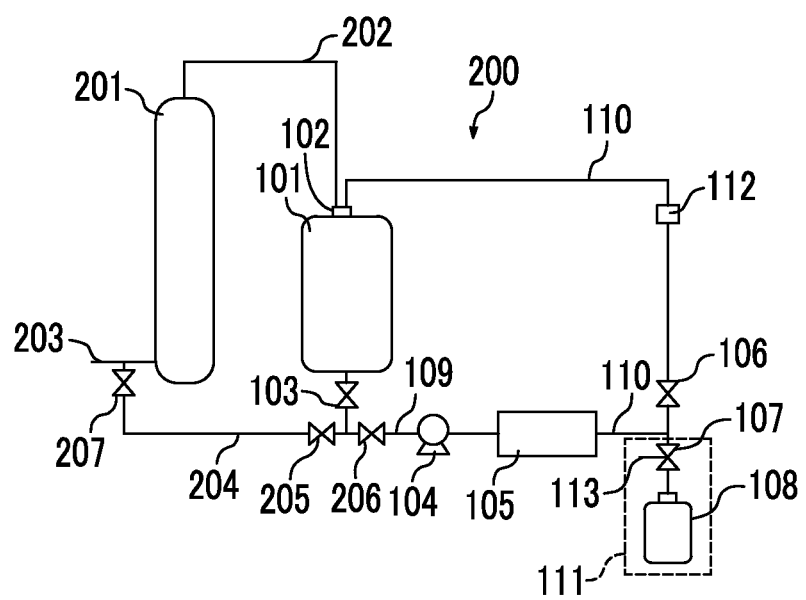
FIG. 2 is a schematic diagram showing another embodiment of the purification apparatus that can be used in the method for producing a composition of the present invention.

FIG. 2 is a schematic diagram showing another embodiment of a purification apparatus that can be used for filtering a material to be treated. The purification apparatus 200 includes the tank 101 and the filtration device 105 and is further provided with a distillation column 201 which is connected to the tank 101 and a pipe line 202, a pipe line 204, and a pipe line 203 and is disposed so as to be able to transfer a fluid between the tank 101 and the distillation column 201 through each of the pipe lines. On the other hand, the purification apparatus that can be used for filtering the material to be treated may not be necessarily provided with the filtration device 105 and/or the distillation column 201, and may also be provided with a reaction vessel or the like connected to the distillation column 201 through the pipe line 203. In the case where the material to be treated is a hydrogen peroxide water, it may not be necessary to have the distillation column 201 and the reaction vessel or the like connected to the distillation column 201 through the pipe line 203.

In the purification apparatus 200, the fluid supplied to the distillation column 201 through the pipe line 203 is distilled in the distillation column 201. The distilled fluid is accommodated in the tank 101 through the pipe line 202. The supply pipe line 109 is provided with the valve 103 and a valve 206 so that the fluid discharged from the tank 101 can flow into the filtration device 105 by switching with a valve 205 provided in the pipe line 204.

Further, in the purification apparatus 200, the fluid discharged from the tank 101 can flow into the distillation column 201 again. In that case, the switching of the valve 103, the valve 206, and the valve 205 described above causes the fluid to flow from the pipe line 204 through the valve 207 and the pipe line 203 into the distillation column 201.

The material for the wetted part (the definition of the wetted part will be described later) of the purification apparatus is not particularly limited, but from the viewpoint of further reducing foreign materials in the material to be treated, the wetted part is preferably formed of at least one selected from the group consisting of a nonmetallic material and an electropolished metallic material. In the present specification, the term "wetted part" is a site where a fluid may come into contact (for example, a tank inner surface or a pipe inner surface) and is intended to refer to a region with a thickness of 100 nm from the surface.

The nonmetallic material is not particularly limited, but it is preferably a polyolefin resin such as a polyethylene resin, a polypropylene resin, or a polyethylene-polypropylene resin, or a fluorine-containing resin material such as a perfluoro resin. From the viewpoint that the metal atom is less eluted, a fluorine-containing resin is preferable.

The fluorine-containing resin may be, for example, a perfluoro resin, examples thereof include a tetrafluoroethylene resin (PTFE), a tetrafluoroethylene-perfluoroalkyl vinyl ether copolymer (PFA), a tetrafluoroethylene-hexafluoropropylene copolymer resin (FEP), a tetrafluoroethylene-ethylene copolymer resin (ETFE), a trifluorochloroethylene-ethylene copolymer resin (ECTFE), a vinylidene fluoride resin (PVDF), a trifluorochloroethylene copolymer resin (PCTFE), and a fluorinated vinyl resin (PVF).

Among them, a tetrafluoroethylene resin, a tetrafluoroethylene-perfluoroalkyl vinyl ether copolymer, or a tetrafluoroethylene-hexafluoropropylene copolymer resin is preferable as the fluorine-containing resin.

The metallic material is not particularly limited and a known material can be used.

The metallic material may be, for example, a metallic material in which a total content of chromium and nickel is more than 25% by mass with respect to the total mass of the metallic material, with a total content of chromium and nickel being preferably 30% by mass or more. The upper limit value of the total content of chromium and nickel in the metallic material is not particularly limited, but it is generally preferably 90% by mass or less.

Examples of the metallic material include stainless steel and a nickel-chromium alloy.

The stainless steel is not particularly limited and a known stainless steel can be used. Among them, an alloy containing nickel in an amount of 8% by mass or more is preferable, and an austenitic stainless steel containing nickel in an amount of 8% by mass or more is more preferable. Examples of the austenitic stainless steel include Steel Use Stainless (SUS) 304 (Ni content: 8% by mass, Cr content: 18% by mass), SUS 304L (Ni content: 9% by mass, Cr content: 18% by mass), SUS 316 (Ni content: 10% by mass, Cr content: 16% by mass), and SUS 316L (Ni content: 12% by mass, Cr content: 16% by mass).

The nickel-chromium alloy is not particularly limited, and a known nickel-chromium alloy can be used. Above all, a nickel-chromium alloy having a nickel content of 40% to 75% by mass and a chromium content of 1% to 30% by mass is preferable.

Examples of the nickel-chromium alloy include HASTELLOY (trade name, the same applies hereinafter), MONEL (trade name, the same applies hereinafter), and INCONEL (trade name, the same applies hereinafter). More specifically, HASTELLOY C-276 (Ni content: 63% by mass, Cr content: 16% by mass), HASTELLOY C (Ni content: 60% by mass, Cr content: 17% by mass), and HASTELLOY C-22 (Ni content: 61% by mass, Cr content: 22% by mass) can be mentioned.

Further, the nickel-chromium alloy may further contain boron, silicon, tungsten, molybdenum, copper, cobalt, and the like, if necessary, in addition to the above-mentioned alloy.

The method of electropolishing the metallic material is not particularly limited, and any known method can be used. For example, the methods described in paragraphs [0011] to of JP2015-227501A, paragraphs [0036] to [0042] of JP2008-264929A, and the like can be used.

It is presumed that the content of chromium in the passive layer on the surface of the metallic material is higher than the content of chromium in the parent phase by electropolishing. Therefore, it is presumed that metallic impurities containing metal atoms in the material to be treated are less likely to flow out from the distillation column whose wetted part is formed of an electropolished metallic material, so that the distilled material to be treated having a reduced content of impurities can be obtained.

In addition, the metallic material may be buffed. The method of buffing is not particularly limited, and a known method can be used. The size of the abrasive grains used for the finishing of the buffing is not particularly limited, but it is preferably not more than #400 in that irregularities on the surface of the metallic material tend to be smaller. In addition, the buffing is preferably carried out before the electropolishing.

It is preferred that the wetted part is formed of electropolished stainless steel from the viewpoint that foreign materials in the material to be treated can be further reduced. Particularly, in the case where the purification apparatus is equipped with a tank, it is more preferred that the wetted part of the tank is formed of electropolished stainless steel. The content mass ratio of Cr content to Fe content in the wetted part (hereinafter, also referred to as "Cr/Fe") is not particularly limited, but it is generally preferably 0.5 to 4. The Cr/Fe is more preferably more than 0.5 and less than 3.5, and still more preferably 0.7 or more and 3.0 or less, from the viewpoint that metallic impurities and/or organic impurities are less likely to elute in the material to be treated. In the case where the Cr/Fe is more than 0.5, metal elution from the inside of the tank can be suppressed, and in the case where the Cr/Fe is less than 3.5, peeling of the wetted part which is the cause of particles is unlikely to occur.

The method for adjusting Cr/Fe in the metallic material is not particularly limited, and a method of adjusting the content of Cr atoms in the metallic material and a method of making the content of chromium in the passive layer on the polished surface to be larger than the content of chromium in the parent phase by electropolishing.

A coating technique may be applied to the metallic material.

There are largely three types of coating technique: metal coating (various plating), inorganic coating (various chemical conversion treatments, glass, concrete, ceramics, and the like), and organic coating (rust preventive oil, paint, rubber, plastics, and the like).

Examples of preferred coating techniques include surface treatments with rust inhibiting oils, rust inhibitors, corrosion inhibitors, chelate compounds, peelable plastics, or lining agents.

Among them, preferred is a rust inhibitor such as various carboxylic acids including chromate, nitrite, silicate, phosphate, oleic acid, dimer acid, and naphthenic acid, a carboxylic acid metal soap, a sulfonate, an amine salt, or an ester (higher fatty acid glycerin ester, phosphoric acid ester, or the like), a chelate compound such as ethylene diaminetetraacetic acid, gluconic acid, nitrilotriacetic acid, hydroxyethyl ethylenediamine triacetic acid, or diethylenetriamine pentaacetic acid, or fluororesin lining; and particularly preferred is phosphate treatment or fluororesin lining.

By providing the filtration device 105 in the purification apparatus, it is possible to further reduce foreign materials in the material to be treated. The filtration member included in the filtration device 105 is not particularly limited, but at least one selected from the group consisting of a filter having a particle removal diameter of 20 nm or less and a metal ion adsorption filter is preferable, among which a metal ion adsorption filter having a particle removal diameter of 20 nm or less is more preferable.

Filter Having a Particle Removal Diameter of 20 nm or Less

A filter having a particle removal diameter of 20 nm or less has a function of efficiently removing particles having a diameter of 20 nm or more from a material to be treated.

The particle removal diameter of the filter is preferably 1 to 15 nm and more preferably 1 to 12 nm. In the case where the particle removal diameter is less than 15 nm, finer particles can be removed, and in the case where the particle removal diameter is 1 nm or more, a filtration efficiency is improved.

As used herein, the term "particle removal diameter" means a minimum size of particles which can be removed by a filter. For example, in the case where the particle removal diameter of the filter is 20 nm, particles having a diameter of 20 nm or more can be removed.

Examples of the material for the filter include nylon such as 6-nylon or 6,6-nylon, polyethylene, polypropylene, polystyrene, polyimide, polyamideimide, and fluororesin. The polyimide and/or the polyamideimide may have at least one selected from the group consisting of a carboxy group, a salt-type carboxy group, and an —NH— bond. Regarding solvent resistance, fluororesins, polyimides and/or polyamideimides are excellent. From the viewpoint of adsorbing metal ions, nylon such as 6-nylon or 6,6-nylon is particularly preferable.

The filtration device 105 may contain a plurality of the filters. In the case where the filtration device 105 contains a plurality of filters, the other filter is not particularly limited but it is preferably a filter having a particle removal diameter of 50 nm or more (for example, a microfiltration membrane for removing fine particles having a pore diameter of 50 nm or more). In the case where fine particles are present in addition to colloidal impurities, particularly colloidal impurities containing metal atoms such as iron or aluminum in the material to be treated, the filtration efficiency of a filter having a particle removal diameter of 20 nm or less (for example, a microfiltration membrane having a pore diameter of 20 nm or less) is improved, and the particle removing performance is further improved, by carrying out the filtration of the material to be purified using a filter having a particle removal diameter of 50 nm or more (for example, a microfiltration membrane for removing fine particles having a pore diameter of 50 nm or more) before filtration using the filter having a particle removal diameter of 20 nm or less (for example, a microfiltration membrane having a pore diameter of 20 nm or less).

Metal Ion Adsorption Filter

The filtration device 105 preferably contains a metal ion adsorption filter.

The metal ion adsorption filter is not particularly limited, and a known metal ion adsorption filter may be mentioned.

The metal ion adsorption filter is preferably an ion exchangeable filter. Here, the metal ion to be adsorbed is not particularly limited, but for example, one or more metal ions selected from the group consisting of Fe, Ni, Pt, Pd, Cr, Ti, and Al ions are preferable; and all metal ions of Fe, Ni, Pt, Pd, Cr, Ti, and Al ions are more preferable.

From the viewpoint of improving the metal ion adsorption performance, the metal ion adsorption filter preferably contains an acid group on the surface thereof. Examples of the acid group include a sulfo group and a carboxy group.

Examples of the base material (material) constituting the metal ion adsorption filter include cellulose, diatomaceous earth, nylon, polyethylene, polypropylene, polystyrene, and fluororesin. From the viewpoint of efficiency of adsorbing metal ions, nylon is particularly preferable.

Also, the metal ion adsorption filter may be made of a material containing polyimide and/or polyamideimide. The metal ion adsorption filter may be, for example, a polyimide and/or polyamideimide porous membrane described in JP2016-155121A.

The polyimide and/or polyamideimide porous membrane may contain at least one selected from the group consisting of a carboxy group, a salt-type carboxy group, and an —NH— bond. In the case where the metal ion adsorption filter is made of fluororesin, polyimide and/or polyamideimide, the filter has better solvent resistance.

Organic Impurity Adsorption Filter

The filtration device 105 may further contain an organic impurity adsorption filter. The organic impurity adsorption filter is not particularly limited, and a known organic impurity adsorption filter may be mentioned.

Among them, in terms of improving the organic impurity adsorption performance, the organic impurity adsorption filter is preferably a filter having an organic framework capable of interacting with an organic impurity on the surface (in other words, a filter whose surface is modified by an organic framework capable of interacting with an organic impurity). The organic framework capable of interacting with an organic impurity may be, for example, a chemical structure capable of reacting with an organic impurity to capture the organic impurity in an organic impurity adsorption filter. More specifically, in the case of including n-long chain alkyl alcohol (structural isomer in the case of using 1-long chain alkyl alcohol as an organic solvent) as an organic impurity, an alkyl group is mentioned as the organic framework. In the case where dibutylhydroxytoluene (BHT) is contained as an organic impurity, a phenyl group is mentioned as the organic framework.

Examples of the base material (material) constituting the organic impurity adsorption filter include active carbon-supported cellulose, diatomaceous earth, nylon, polyethylene, polypropylene, polystyrene, and fluororesin.

As the organic impurity adsorption filter, a filter in which activated carbon is adhered to a nonwoven fabric, described in JP2002-273123A and JP2013-150979A, can also be used.

As the organic impurity adsorption filter, a physical adsorption method other than the chemical adsorption (adsorption using an organic impurity adsorption filter having an organic framework capable of interacting with an organic impurity on the surface) described above can also be applied.

For example, in the case where BHT is contained as an organic impurity, the structure of BHT is larger than 10 angstroms (=1 nm). Therefore, by using an organic impurity adsorption filter having a pore diameter of 1 nm, BHT cannot pass through the pore of the filter. That is, BHT is physically captured by the filter, which is thus removed from the substance to be purified. In this way, organic impurities can be removed not only by applying a chemical interaction but also by applying a physical removal method. In this case, however, a filter having a pore diameter of 3 nm or more is used as a "particle removing filter", and a filter having a pore diameter of less than 3 nm is used as an "organic impurity adsorption filter".

Again, for the use of filter, different filters may be used in combination. As a method of combining different filters, for example, a method combining the first filter and the second filter as described above can be mentioned. In that case, filtering by a first filter may be carried out only once or two or more times. In the case where filtering is carried out twice or more by combining different filters, the filters may be of the same type as or different types from each other, but they are preferably different types from each other. Typically, at least one of the pore diameter or the constituent material is different between the first filter and the second filter.

The pore diameter for a second or subsequent filtering is preferably made smaller than or equal to that for the first filtering. In addition, first filters having a different pore diameter in the above-mentioned range may be used in combination. The pore diameter herein can be set by referring to nominal values of filter manufacturers. Commercially available filters can be selected from various filters supplied by, for example, Nihon Pall Ltd., Advantec Toyo Kaisha, Ltd., Nihon Entegris K.K. (formerly Nihon Mykrolis K.K.) or Kitz Micro Filter Corporation. In addition, "P-nylon filter (pore diameter: 0.02 μm, critical surface tension: 77 mN/m)" made of polyamide; (manufactured by Nihon Pall Ltd.), "PE-Clean Filter (pore diameter: 0.02 μm)" made of high density polyethylene; (manufactured by Nihon Pall Ltd.), and "PE•Clean filter (pore diameter: 0.01 μm)" made of high density polyethylene; (manufactured by Nihon Pall Ltd.) can also be used.

It is preferred that the purification apparatus is cleaned beforehand with a cleaning liquid in that foreign materials in the material to be treated can be further reduced. In this method, the cleaning liquid is supplied from the supply port 102 of the tank 101. Although the supply amount of the cleaning liquid is not particularly limited, it is preferable to use an amount capable of sufficiently cleaning the wetted part of the tank 101, and the capacity of the supplying cleaning liquid is preferably 30 vol % or more with respect to the capacity of the tank 101. In the case where the cleaning liquid is supplied from the supply port 102, the valve 103 may be closed or opened, but in terms of easier cleaning of the tank 101, the valve 103 is preferably closed in the case of supplying the cleaning liquid from the supply port 102.

The cleaning liquid supplied to the tank 101 may be immediately transferred in the purification apparatus or may be transferred in the purification apparatus (for example, through the supply pipe line 109) after cleaning the inside of the tank 101. The method of cleaning the inside of the tank 101 with a cleaning liquid is not particularly limited, but there is, for example, a method of cleaning by rotating a stirring blade (not shown) provided in the tank 101. The time to clean the tank using the cleaning liquid is not particularly limited and may be appropriately selected depending on the material of the wetted part of the tank 101, the possibility of contamination, and the like. Generally, the cleaning time is preferably about 0.1 second to 48 hours. In the case where only the tank 101 is cleaned, for example, the cleaning liquid after cleaning may be discharged from a discharge port (not shown) provided at the bottom of the tank.

The method of cleaning the supply pipe line 109 and the like of the purification apparatus 100 with the use of the cleaning liquid is not particularly limited, but it is preferably a method in which the valve 103 and the valve 106 are opened, the valve 107 is closed, the pump 104 is operated, and the cleaning liquid is circulated in the purification apparatus through the supply pipe line 109 and the circulation pipe line 110 (hereinafter, also referred to as "circulation cleaning"). In this manner, foreign materials and the like adhered to the wetted parts of the tank 101, the filtration device 105, the supply pipe line 109, and the like can be efficiently dispersed and/or can be more efficiently dissolved with a cleaning liquid while transferring the cleaning liquid.

Particularly, in the case where the purification apparatus includes a filtration device, circulation cleaning is more preferable as the cleaning method. An example of the circulation cleaning will be described with reference to FIG.

1. First, the cleaning liquid supplied from the tank 101 to the purification apparatus through the valve 103 returns (circulates) to the tank 101 again through the supply pipe line 109 (through the filtration device 105, the circulation pipe line 110, and the valve 106). At this time, the cleaning liquid is filtered by the filtration device 105 to remove particles and the like dissolved and dispersed in the cleaning liquid, and therefore the cleaning effect can be further enhanced.

As another mode of the cleaning method, for example, it may also be possible to use a method in which the valve 103 and the valve 107 are opened, the valve 106 is closed, the pump 104 is operated, and the cleaning liquid supplied into the purification apparatus from the supply port 102 of the tank 101 is allowed to flow through the valve 103 and the pump 104 to the filtration device 105, and thereafter the cleaning liquid is discharged to the outside of the purification apparatus through the valve 107 without circulating (in the present specification, this method will be hereinafter also referred to as "batch cleaning"). In this case, a certain amount of the cleaning liquid may be supplied intermittently into the purification apparatus as described above, or may be continuously supplied into the purification apparatus.

Filtering in Fourth Step

In the case of carrying out filtering in the fourth step, it is also preferable to carry out filtering of the hydrogen peroxide composition by the following method besides the above-mentioned method. Also in the first step, filtering by the following method may be carried out.

Any filter may be used without particular limitation as long as it is conventionally used for filtration or the like. For example, the filter may be a filter made of a fluororesin such as polytetrafluoroethylene (PTFE) or tetrafluoroethylene-perfluoroalkyl vinyl ether copolymer (PFA), a polyamide-based resin such as nylon, a polyolefin resin such as polyethylene or polypropylene (PP) (including ones having a high density and an ultra-high molecular weight), or the like. Among these materials, a material selected from the group consisting of polyethylene, polypropylene (including high-density polypropylene), a fluororesin such as PTFE or PTA, and a polyamide-based resin such as nylon is preferable, among which a filter made of a fluororesin such as PTFE or PTA is more preferable. By using a filter formed by these materials, it is possible to effectively remove highly polar foreign materials that are likely to cause defects (residue defects and particle defects) in the semiconductor substrate, and it is also possible to efficiently reduce the amount of the specific metal component of the present invention.

The critical surface tension of the filter is preferably 70 mN/m or more, more preferably 95 mN/m or less, and still more preferably 75 mN/m or more and 85 mN/m or less. The value of critical surface tension is the manufacturer's nominal value. By using the filter having the critical surface tension in the above range, a foreign material having high polarity which is likely to cause defects (residue defects and particle defects) of the semiconductor substrate can be effectively removed, and the amount of the specific metal component of the present invention can be efficiently reduced.

In one embodiment, the pore diameter of the filter is preferably about 2 to 20 nm, and more preferably 2 to 15 nm. By specifying the pore diameter of the filter to be in this range, it becomes possible to reliably remove fine foreign materials such as impurities or aggregates contained in the hydrogen peroxide composition, while suppressing clogging of the filter, and in addition, the amount of the specific metal component of the present invention can be reduced efficiently.

For the use of filter, different filters may be used in combination. In that case, filtering by a first filter may be carried out only once or two or more times. In the case where filtering is carried out twice or more by combining different filters, the pore diameter for a second or subsequent filtering is preferably made smaller than or equal to that for the first filtering. In addition, first filters having a different pore diameter in the above-mentioned range may be used in combination. The pore diameter herein can be set by referring to nominal values of filter manufacturers. Commercially available filters can be selected from various filters supplied by, for example, Nihon Pall Ltd., Advantec Toyo Kaisha, Ltd., Nihon Entegris K.K. (formerly Nihon Mykrolis K.K.) or Kitz Micro Filter Corporation. In addition, "P-nylon filter (pore diameter: 0.02 µm, critical surface tension: 77 mN/m)" made of polyamide; (manufactured by Nihon Pall Ltd.), "PE•Clean Filter (pore diameter: 0.02 µm)" made of high density polyethylene; (manufactured by Nihon Pall Ltd.), and "PE-Clean filter (pore diameter: 0.01 µm)" made of high density polyethylene; (manufactured by Nihon Pall Ltd.) can also be used.

As the second filter, it is possible to use a filter formed of the same material or the like as the first filter. The pore diameter of the second filter is preferably about 1 to 10 nm.

Further, in the present invention, the filtering step is preferably carried out at room temperature (25° C.) or lower, more preferably 23° C. or lower, and still more preferably 20° C. or lower, and preferably 0° C. or higher, more preferably 5° C. or higher, and still more preferably 10° C. or higher.

In the filtering step, particulate foreign materials and impurities can be removed, but in the case of being the above temperature, the amount of the particulate foreign materials and/or impurities dissolved in the hydrogen peroxide composition is reduced, which results in efficient removal thereof by filtering.

Particularly, in the case where the hydrogen peroxide composition contains a metal component containing a specific atom selected from the group consisting of Ni, Pt, Pd, Cr, Ti, and Al in an amount exceeding the desired amount of the present application, it is preferable to filter the metal component at the above temperature. Although the mechanism for this is not clear, it is thought that, in the case where the hydrogen peroxide composition contains a metal component containing a specific atom selected from the group consisting of Ni, Pt, Pd, Cr, Ti, and Al, most of the metal components exists in a particulate colloidal state. In the case of filtering at the above temperature, it is thought that some colloidally suspended metal components aggregate, so that those aggregates are efficiently removed by filtering, thus making it easier to adjust to the desired amount of the metal component in the present application.

In addition, it is preferred that the filter to be used is treated before filtering the hydrogen peroxide composition. The liquid used for this treatment is not particularly limited, but it is preferred that the metal content in the liquid is less than 0.001 parts per trillion (ppt) by mass. For example, in addition to the above-mentioned water, there is a liquid in which another organic solvent is purified so that the metal content is within the above range, a composition itself of the present invention (prepared beforehand) or a dilution thereof, or a liquid in which the composition of the present invention is further purified so that metal components, impurities, coarse particles, and the like are further reduced. The desired effect of the present invention can be significantly obtained by pretreating the filter with a liquid having a reduced metal content as described above.

The step of purifying a hydrogen peroxide composition in the fourth step is preferably carried out by combining each of the above purification methods.

By passing through the first step to the fourth step, it is possible to obtain the composition of the present invention highly purified to such an extent that can be used for semiconductor device manufacturing.

In addition, the composition of the present invention is as described above. The acid contained in the composition of the present invention may be an acid such as phthalic acid by-produced in the process of synthesizing hydrogen peroxide by an anthraquinone method, or may be an acid separately added in the fourth step or after the fourth step. From the viewpoint of further improving the purity of the composition and the effect of the present invention, it is preferable to add an acid component (preferably phosphoric acid or phosphoric acid derivative) to the composition in the fourth step, and it is more preferable to further carry out the purification step after addition of this acid component.

<Quantitative Method>

In addition, various quantities of water or a solvent, a raw material component, or an acid component contained in the composition or the like of the present invention, or anthraquinone compounds can be analyzed by ion chromatography.

In addition, various quantities of water or a solvent, a raw material component, or a Fe component or metal component contained in the composition or the like of the present invention can be analyzed by an inductively coupled plasma mass spectrometry method (ICP-MS method, for example, Agilent 7500cs manufactured by Yokogawa Analytical Systems, Inc. can be used as a measurement apparatus) or the like. In the ICP-MS method, quantification is made in terms of total mass of metal atoms, that is, total mass of metal ion (ionic metal) and metal particle (non-ionic metal) (also referred to as "total metal amount").

In addition, according to recently developed single nanoparticle-inductively coupled plasma-mass spectrometry (SNP-ICP-MS) measurement, it became possible to measure the amount of metal atoms present in the solution separately in terms of metal ion (ionic metal) and metal particle (non-ionic metal), respectively. Here, the metal particle (non-ionic metal) is a component that does not dissolve in the solution but exists as a solid.

Heretofore, the amount of metal atoms contained in a treatment liquid or the like for semiconductor manufacturing is usually analyzed by an ICP-MS method or the like, and depending on a conventional method such as ICP-MS method, it is impossible to distinguish between the metal atom-derived ionic metal and the metal particle (non-ionic metal), whereby quantification is made in terms of total mass of metal atoms, that is, total mass of ionic metal and particulate metal (non-ionic metal) (hereinafter, also referred to as "total metal mass" or the like).

Metal atoms contained as impurities in a treatment liquid for semiconductor manufacturing are one of the factors that cause defects in fine patterns and fine semiconductor elements. For this reason, it was considered that the smaller the amount of metal atoms contained in the treatment liquid for semiconductor manufacturing, the better. However, the present inventors have found that the amount of metal atoms contained in the treatment liquid does not necessarily correlate with the occurrence rate of defects, and there is variation in the occurrence rate of defects.

As a result of extensive studies for an effect of each of the metal atom-derived ionic metal and the metal particle (non-ionic metal) contained in a treatment liquid for semiconductor manufacturing, which can be identified and quantified by the measurement using an SNP-ICP-MS method, on defects, the present inventors have found that the effect of the amount of metal particles (non-ionic metal) is extremely large for the occurrence of defects, and there is a correlation between the amount of metal particles (non-ionic metal) and the defect occurrence. As an apparatus for the SNP-ICP-MS method, for example, using an Agilent 8800 triple quadrupole inductively coupled plasma mass spectrometry (ICP-MS, for semiconductor analysis, option #200) manufactured by Agilent Technologies, Inc., the measurement can be carried out according to the method described in the Examples. In addition to the above apparatus, NexION 350S manufactured by PerkinElmer Co., Ltd., and Agilent 8900 manufactured by Agilent Technologies, Inc. can also be mentioned.

In the composition of the present invention, the content of Fe particles (non-ionic metal) as measured by the SNP-ICP-MS method is preferably 0.01 ppt by mass to 0.1 ppb by mass with respect to the total mass of the composition from the viewpoint of improving defect performance and securing temporal stability.

In the case where the composition of the present invention contains a metal component containing a specific atom selected from the group consisting of Ni, Pt, Pd, Cr, Ti, and Al, and the metal component contains metal particles (non-ionic metal), the content of the metal particles in the composition of the present invention is preferably 0.01 ppt by mass to 100 ppt by mass, more preferably 0.01 ppt by mass to 50 ppt by mass, and still more preferably 0.01 ppt by mass to 10 ppt by mass with respect to the total mass of the composition for each specific atom, from the viewpoint of improving defect performance and securing temporal stability. That is, in the case where the composition of the present invention contains, for example, only Pt particles, the Pt particles have the above-mentioned numerical range. On the other hand, in the case where the composition of the present invention contains, for example, Pt particles and Ni particles, each of the Pt particles and the Ni particles has the above-mentioned numerical range. In addition, the content of the metal particles is a value measured by the SNP-ICP-MS method described above.

It is preferred that handling including preparation of the composition of the present invention, opening and/or cleaning of the reservoir container, filling of the composition and the like, treatment analysis, and measurement are all carried out in a clean room. It is preferred that the clean room satisfies the 14644-1 clean room standard. It is preferable to satisfy any one of International Organization for Standardization (ISO) class 1, ISO class 2, ISO class 3, or ISO class 4, more preferably ISO class 1 or ISO class 2, and still more preferably ISO class 1.

<Organic Impurities>

For the measurement of the content of organic impurities, a gas chromatograph mass spectrometer (product name "GCMS-2020", manufactured by Shimadzu Corporation) may be used in some cases. In addition, although not subject to any particular limitation, in the case where the organic impurity is a high molecular weight compound, identification of the structure and determination of the concentration may be carried out from the decomposed substance, by a method such as Py-QTOF/MS (pyrolyzer quadrupole time-of-flight type mass spectrometry), Py-IT/MS (pyrolyzer ion trap type mass spectrometry), Py-Sector/MS (pyrolyzer magnetic field type mass spectrometry), Py-FTICR/MS (pyrolyzer Fourier transform ion cyclotron type mass spectrometry), Py-Q/MS (pyrolyzer quadrupole type mass spectrometry), or Py-IT-TOF/MS (pyrolyzer ion trap time-of-flight type mass spectrometry). For example, a device such as manufactured by Shimadzu Corporation can be used for Py-QTOF/MS.

<Impurities and Coarse Particles>

Also, it is preferred that the composition of the present invention does not substantially contain coarse particles.

The coarse particles contained in the composition of the present invention refer to coarse particles which are particles such as dust, dirt, organic solid or inorganic solid contained as impurities in the raw material, or particles such as dust, dirt, organic solid or inorganic solid brought as contaminants during the preparation of the composition, and finally not dissolved and present as particles in the composition of the present invention. The amount of coarse particles present in the composition of the present invention can be measured in a liquid phase by using a commercially available measurement apparatus in a light scattering type in-liquid particle measuring method using a laser as a light source.

<Kit and Concentrate>

The composition of the present invention may be a kit to which other raw materials are separately added. In this case, as other raw materials to be separately added at the time of use, other compounds can be mixed and used depending on the application, in addition to a solvent such as water and an organic solvent. From the viewpoint that the effect of the present invention can be significantly obtained, in the case where the solvent that can be used at this time is such that the content ratio of the Fe component or the metal component contained in the solvent is within the same range as the specific value range in the above-mentioned composition of the present invention, the desired effect of the present invention can be significantly obtained even with a kit and concentrate.

<Applications>

The composition of the present invention is preferably used for manufacturing a semiconductor device. The composition of the present invention can be used for any step for manufacturing a semiconductor device. Specifically, in a step of manufacturing a semiconductor device including a lithography step, an etching step, an ion implantation step, a peeling step, or the like, the composition of the present invention is used as a treatment liquid for treating an organic or inorganic substance after completion of each step or before going to the next step, in which, specifically, the composition of the present invention is suitably used as a cleaning liquid, a removing liquid, a peeling liquid, or the like.

In the case where the composition of the present invention is used for manufacturing a semiconductor device, there is no particular limitation. For example, for the purpose of removing inorganic metal ions on a silicon substrate, the composition of the present invention is suitably used for removing metal ions from the silicon substrate, in such a manner that the composition is mixed with hydrochloric acid, followed by a treatment with a chemical liquid called Standard Clean 2 (SC-2). Further, for the purpose of removing particles on the silicon substrate, the composition of the present invention is suitably used for removing silicon particles from the silicon substrate, in such a manner that the composition is mixed with ammonia, followed by a treatment with a chemical liquid called Standard Clean 1 (SC-1). Further, for the purpose of removing a resist on the substrate, the composition of the present invention is suitably used for removing the resist from the semiconductor substrate, in such a manner that the composition is mixed with sulfuric acid, followed by a treatment with a chemical liquid called sulfuric acid hydrogen peroxide mixture (SPM). The removal of the resist here also includes removal of a resist film, an etching residue, an antireflection film, and an ashing residue. The etching residue refers to a residue generated in the case where the resist is subjected to an etching treatment and the ashing residue refers to a residue generated in the case where the resist is subjected to an ashing treatment.

Further, the composition of the present invention can also be suitably used for applications other than for semiconductor manufacturing. For example, it can also be used as a cleaning liquid, a peeling liquid, or a removing liquid for a polyimide, a sensor resist, or a lens resist.

Further, the composition of the present invention can also be used for cleaning applications other than the above applications, and can be suitably used for cleaning a container, a piping, a substrate (for example, wafer or glass), or the like. Further, the composition of the present invention can also be used for various applications such as a raw material of an organic peroxide or an inorganic peroxide; a raw material of an organic compound; a raw material of an epoxy compound; bleaching of paper, pulp, wood, or the like; a raw material of a fiber; bleaching of a fiber; a metal oxidizing agent in smelting process; a raw material of food and medicine; and a detergent or disinfectant for manufacturing facilities or containers.

[Composition Reservoir]

The composition reservoir of the present invention has a storage container and the above-described composition of the present invention contained in the storage container, in which the region of the storage container in contact with the composition is formed of a material containing nonmetal as a main component. Here, the main component is intended to mean that a predetermined component constitutes 80% by mass or more of the region which is in contact therewith.

The form of the storage container is not particularly limited as long as the region in contact with the composition of the present invention is formed of a material containing nonmetal as a main component, and the composition of the present invention can be filled, stored, transported, and used in any container. For a semiconductor application, the container is preferably a container whose inside is of high degree of cleanliness and from which the impurities are less eluted. Examples of the container that can be used include, but are not limited to, "Clean Bottle" series (manufactured by Aicello Chemical Co., Ltd.), and "Pure Bottle" (manufactured by KODAMA PLASTICS Co., Ltd.). The region of this container in contact with the composition of the present invention, for example, the inner wall of the accommodating portion or the flow path of the composition of the present invention, is formed of a material containing nonmetal as a main component. From the viewpoint of preventing contamination of solvent substances from the container due to excessive affinity with the container, the region of the container in contact with the composition of the present invention is preferably formed of a material selected from the group consisting of high density polyethylene (HDPE), tetrafluoroethylene-perfluoroalkyl vinyl ether copolymer (PFA), and polytetrafluoroethylene (PTFE). Among them, the region of the container in contact with the composition of the present invention is more preferably formed of a material containing nonmetal as a main component having a contact angle with water of 60 to 120°, and still more preferably a fluorine-based resin (perfluoro resin). Particularly, as compared with the case of using a storage container in which the region in contact with the composition of the present invention is of a polyethylene resin, a polypropylene resin, or a polyethylene-polypropylene resin, in the case of using a storage container in which the region in contact with the composition of the present invention as described above is of a fluorine-based resin, it is possible to suppress the occurrence of defects such as elution of ethylene or propylene oligomer, which is therefore preferable.

Specific examples of the container in which the region in contact with the composition of the present invention is of a fluorine-based resin include a FluoroPure PFA composite drum manufactured by Nihon Entegris K.K. In addition, the containers described in page 4 and the like of JP1991-502677A (JP-H03-502677A), page 3 and the like of WO2004/016526A, pages 9 and 16 and the like of WO99/46309A, and the like can also be used. For these containers, it is preferable to clean the inside of the container before filling. The liquid used for this cleaning is not particularly limited, but it is preferred that the metal content in the liquid is less than 0.001 parts per trillion (ppt) by mass.

Depending on the application, for example, in addition to the above-mentioned water, in the case where a liquid in which another organic solvent is purified so that the metal content is within the above range, a composition itself of the present invention (prepared beforehand) or a dilution thereof, or a liquid in which the composition of the present invention is further purified so that metal components, impurities, coarse particles, and the like are further reduced is used for cleaning, the desired effect of the present invention can be significantly obtained.

In addition, foreign materials adhering to lids are removed by cleaning the lids of various containers with an acid or an organic solvent before cleaning the container, so that incorporation of foreign materials from the lids can be prevented, which is therefore preferable.

Further, the composition of the present invention may be bottled, transported and stored in a container such as a gallon bottle or coated bottle after production thereof. The gallon bottle may be made of glass material or may be made of other materials.

For the purpose of preventing changes in components in the composition during the storage of the composition of the present invention, the inside of the container may be replaced with an inert gas (such as nitrogen or argon) having a purity of 99.99995 vol % or more. In particular, a gas having a low water content is preferable. Further, the temperature during transportation or storage is not particularly limited, but in order to prevent alteration, the temperature may be controlled within the range of −20° C. to 20° C.

EXAMPLES

Hereinafter, the present invention will be described in more detail with reference to Examples. The materials, amount of use, ratios, treatment content, treatment procedure, and the like shown in the following Examples can be appropriately modified without departing from the spirit and scope of the present invention. Therefore, the scope of the present invention should not be interpreted restrictively by the following Examples.

<Purification of Raw Materials and the Like>

Each raw material and each catalyst used in each of Examples shown below were further purified by distillation, ion exchange, filtration, or the like in advance using a high-purity grade having a purity of 99% or more.

Ultrapure water used in the Examples was prepared such that the content of each atom of Na, Ca, and Fe was less than 10 ppt by mass, by subjecting to purification using the method described in JP2007-254168A and subjecting to measurement using a conventional ICP-MS method to be described later.

Preparation, filling, storage, analysis, and measurement of the compositions of Examples and Comparative Examples (hereinafter, also referred to as "hydrogen peroxide composition") were all carried out in a clean room having a level satisfying ISO class 2 or lower. In addition, the container to be used was used after being preliminarily cleaned with the composition of the present invention. In order to improve the measurement accuracy, in the measurement of the content of the metal component and the measurement of the content of water, for the measurement of those below the detection limit under normal measurement, the measurement was carried out by concentrating a composition to $1/100$ in terms of volume, and the content was calculated in terms of concentration in the composition before being concentrated.

Example 1

[Preparation of Hydrogen Peroxide Composition]

A hydrogen peroxide composition was prepared by carrying out the first step to the fourth step shown below. (First step: raw material purification step)

In the first step, 2-ethylanthraquinone serving as a raw material was repeatedly passed through a cation exchange resin packed in a column until the concentration of metal ions contained in the raw material was 1 ppm by mass. Thereafter, 2-ethylanthraquinone was isolated.

(Second Step: Hydrogen Peroxide Synthesis Step)

To a solution obtained by dissolving 2-ethylanthraquinone in benzene, a Pt catalyst was added to obtain a suspension. Subsequently, the obtained suspension was brought into contact with hydrogen to hydrogenate 2-ethylanthraquinone under the Pt catalyst to produce 2-ethylanthrahydroquinone. Further, the obtained composition was filtered to remove the catalyst.

Thereafter, the obtained composition was brought into contact with oxygen in the air to oxidize 2-ethylanthrahydroquinone to produce 2-ethylanthraquinone and hydrogen peroxide.

(Third Step: Hydrogen Peroxide Separation Step)

The hydrogen peroxide produced in the second step was extracted with water and isolated to obtain aqueous hydrogen peroxide solution (hydrogen peroxide composition).

(Fourth Step: Hydrogen Peroxide Composition Purification Step)

After carrying out the third step, the aqueous hydrogen peroxide solution was purified with a cation exchange resin. As a result, metal components including atoms such as aluminum, calcium, magnesium, and sodium contained in the aqueous hydrogen peroxide solution were removed. A strongly acidic cation exchange resin having a sulfonate group (—SO3H) as an ion exchange group was used as the cation exchange resin. The concentration of metal ions contained in the aqueous hydrogen peroxide solution in the process so far was about 1 ppb by mass. Thereafter, using a polytetrafluoroethylene (PTFE) filter having an average pore diameter of 0.001 to 0.01 μm or less, the obtained aqueous hydrogen peroxide solution was filtered to further reduce the concentration of metal atoms. Then, phosphoric acid was added to the aqueous hydrogen peroxide solution. Thereafter, the aqueous hydrogen peroxide solution was brought into contact with a mixed bed of an anion exchange resin and a cation exchange resin. As a result, it was confirmed that the metal ion concentration in the aqueous hydrogen peroxide solution was on the level of ppt.

[Evaluation]

Next, the obtained aqueous hydrogen peroxide solution (hydrogen peroxide composition) was subjected to various evaluations described below.

(Measurement of Fe Component in Composition)

In the ICP-MS analysis (meaning conventional ICP-MS analysis, not SNP-ICP-MS analysis), the concentration of each atom was measured in the same manner as in SNP-ICP-MS analysis to be described later, except that the analysis software was replaced with analysis software as an ICP-MS analyzer to be described later.

With regard to the Fe component, the amount of Fe particles is measured by SNP-ICP-MS analysis to be described later, and the amount of Fe ions can be calculated by subtracting the amount of Fe particles measured by SNP-ICP-MS analysis from the amount of Fe component (total metal amount) measured by ICP-MS analysis.

(Single Nanoparticle-Inductively Coupled Plasma-Mass Spectrometry (SNP-ICP-MS) Measurement)

<<Measurement of Content Ratio of Fe Particles>>

The content ratio of Fe particles was measured using "Nexion 350S" manufactured by PerkinElmer Co., Ltd.

1) Preparation of Standard Substance

Ultrapure water was weighed into a clean glass container and the metal particles to be measured having a median diameter of 50 nm were added so as to have a concentration of 10,000 particles/ml, and the dispersion liquid treated by an ultrasonic washing machine for 30 minutes was used as a standard substance for transport efficiency measurement.

2) Measurement Conditions

Using a PFA concentric nebulizer (note that the "PFA" is a copolymer of tetrafluoroethylene and perfluoroalkyl vinyl ether), a quartz cyclonic spray chamber, and a quartz torch injector having an inner diameter of 1 mm, a liquid to be measured was aspirated at a rate of about 0.2 mL/min. The oxygen addition amount was 0.1 L/min, the plasma output was 1600 W, and the cell was purged by an ammonia gas. The time resolution was analyzed at 50 µs.

3) The Content Ratio of Fe Particles was Measured Using the Following Analysis Software Attached to the Manufacturer.

Content ratio of Fe particles: Syngistix nano application module dedicated for nanoparticle analysis "SNP-ICP-MS"

4) The Content Ratio of Fe Atoms was Measured Using the Following Analysis Software Attached to the Manufacturer (ICP-MS Analysis).

Content ratio of Fe atoms: Syngistix for ICP-MS software (Measurement of Metal Components Derived from Other Specific Atoms (Ni, Pt, Pd, Cr, Ti, and Al) in Composition)

Agilent 8800 triple quadrupole ICP-MS (for semiconductor analysis, option #200) was used for the measurement. According to the measurement apparatus, it is possible to classify the ionic metal and the non-ionic metal in each measurement sample and to measure the content of each. The sum of the content of the ionic metal and the content of the non-ionic metal corresponds to the total metal amount.

Measurement Conditions

For the sample introduction system, a quartz torch and a concentric PFA (perfluoroalkoxyalkane) nebulizer (for self-suction), and a platinum interface cone were used. The measurement parameters of the cool plasma condition are as follows.

Radio Frequency (RF) output (W): 600
Carrier gas flow rate (L/min): 0.7
Make-up gas flow rate (L/min): 1
Sampling depth (mm): 18

(Measurement of Acid and Anthraquinone Compound in Composition)

The acid or anthraquinone compound in the composition was measured by the following method.

The measurement was carried out by liquid chromatography (ion exchange chromatography mass spectrometry) using an ion exchange resin as a stationary phase and an aqueous solution of an electrolyte as a mobile phase (eluent). The ion chromatography mass spectrometry (IC-MS) is a method in which a mass spectrometer is connected as a detector of an IC. In the mass spectrometer, target substance is separated according to the mass/charge number (m/z), so electrospray ionization (ESI) was used for the ionization method and a tandem mass spectrometer was used for the mass spectrometer. Further, the separated molecular ion was cleaved with a collision cell, and the resulting product ion (reflecting the structure of the molecular ion) was detected.

(Evaluation of Storage Stability of Hydrogen Peroxide Composition)

The hydrogen peroxide composition immediately after preparation was titrated by a known method using potassium iodide and sodium thiosulfate to measure the amount of hydrogen peroxide in the hydrogen peroxide composition immediately after preparation. The hydrogen peroxide composition was allowed to stand at 25° C. for 1 week and stored, and then the amount of hydrogen peroxide (residual amount) in the hydrogen peroxide composition was determined by the same method as described above.

Subsequently, the decomposition rate was calculated by the following equation to evaluate the storage stability.

(Decomposition rate)=[(amount of hydrogen peroxide in hydrogen peroxide composition immediately after preparation)−(residual amount of hydrogen peroxide in hydrogen peroxide composition after storage over time)]/(amount of hydrogen peroxide in hydrogen peroxide composition immediately after preparation)×100

Evaluation standards are as follows. In the following standards, in the case where the evaluation is "D" or higher, it satisfies the practical requirement of storage stability and therefore "C" or higher is preferable.

"A": Decomposition rate of hydrogen peroxide is less than 5%
"B": Decomposition rate of hydrogen peroxide is 5% or more and less than 10%
"C": Decomposition rate of hydrogen peroxide is 10% or more and less than 20%
"D": Decomposition rate of hydrogen peroxide is 20% or more and less than 30%
"E": Decomposition rate of hydrogen peroxide is 30% or more (Evaluation of Oxidizing Power of Hydrogen Peroxide Composition)

The oxidation potential (oxidizing power) of the hydrogen peroxide composition was determined by an electrochemical method. The hydrogen electrode was used as a reference electrode, and the open circuit potential (OCP) at that time was obtained.

Evaluation standards are as follows.
"A": Oxidizing power is 1.8 mV or more
"B": Oxidizing power is 1.6 mV or more and less than 1.8 mV
"C": Oxidizing power is less than 1.6 mV (Defect Performance of Hydrogen Peroxide Composition (Measurement of Number of Defects Adhering to Semiconductor Substrate))

The number of particles having a diameter of 32 nm or more (hereinafter, referred to as "defects") present on the surface of a silicon oxide film substrate with a diameter of 300 mm was measured with a wafer top surface inspection apparatus (SP-5, manufactured by KLA-Tencor Corporation). Next, this silicon oxide film substrate was set in a spin discharge apparatus, and the obtained hydrogen peroxide composition was discharged at a flow rate of 1.5 L/min onto the surface of the silicon oxide film substrate while rotating the substrate. Thereafter, a rinsing treatment was carried out, followed by drying. With respect to the obtained sample, the number of defects present on the surface of the silicon oxide film substrate was measured again using the apparatus (SP-5), and the difference from the initial value was taken as the number of defects. The obtained number of defects was evaluated based on the following standards, and the results are shown in Table 1. In the following standards, in the case where the evaluation is "C" or higher, the ability to suppress defects required as a treatment liquid for manufacturing a semiconductor device is achieved.

"A": The number of defects is 0 or more and 50 or less
"B": The number of defects is more than 50 and 100 or less
"C": The number of defects is more than 100 and 500 or less
"D": The number of defects is more than 500 and 1000 or less
"E": The number of defects is more than 1000

Examples 2 to 23 and Comparative Examples 1 and 2

Hydrogen peroxide compositions of Examples 2 to 23 and Comparative Examples 1 and 2 were prepared by modifying the method for preparing a hydrogen peroxide composition of Example 1 and the materials used so that each hydrogen peroxide composition having the composition shown in Table 1 below was obtained, and then evaluated in the same manner as in Example 1. The results are shown in Table 1.

In Table 1, for example, $10^{\wedge}(-1)$ is intended to mean "10-1" (0.1). Also, for example, $10^{\wedge}1$ is intended to mean "101" (10).

In addition, in Table 1, "Acid" includes a phthalic acid derivative produced as the decomposition product of anthraquinone in addition to the phosphoric acid added in the fourth step.

Further, with respect to the various metal components in the columns (D) and (E) in Table 1, the numerical value means the total metal amount.

Table 2 also shows the composition of the metal component in Table 1, specifically showing metal ions (ionic metal) and metal particles (non-ionic metal) separately. In Table 2, metal particles (non-ionic metal) are various metal particles measured by "SNP-ICP-MS".

TABLE 1

| | Hydrogen peroxide composition | | | | | | |
|---|---|---|---|---|---|---|---|
| | (A) | (B) | | | (E) | | |
| | Hydrogen peroxide (% by mass) | Anthraquinone compound (ppb by mass) | (C) Acid (ppb by mass) | (D) Fe component (by mass) | Pt component (by mass) | Ti component (by mass) | Cr component (by mass) |
| Example 1 | 30% | 0.1 | 0.1 | 10 ppt | 1 ppt | 2.2 ppt | 1 ppt |
| Example 2 | 30% | 0.001 | 0.1 | 10 ppt | 1 ppt | 2 ppt | 1.1 ppt |
| Example 3 | 30% | 0.01 | 0.1 | 10 ppt | 1 ppt | 2.1 ppt | 1.2 ppt |
| Example 4 | 30% | 1000 | 0.1 | 10 ppt | 1 ppt | 2.8 ppt | 1 ppt |
| Example 5 | 30% | 10000 | 0.1 | 10 ppt | 1 ppt | 3.4 ppt | 1.1 ppt |
| Example 6 | 30% | 0.1 | 0.001 | 10 ppt | 1 ppt | 2.2 ppt | 1.5 ppt |
| Example 7 | 30% | 0.1 | 0.01 | 10 ppt | 1 ppt | 2.2 ppt | 1 ppt |
| Example 8 | 30% | 0.1 | 1000 | 10 ppt | 1 ppt | 2.2 ppt | 1 ppt |
| Example 9 | 30% | 0.1 | 0.1 | 0.01 ppt | 1 ppt | 0.02 ppt | 0.02 ppt |
| Example 10 | 30% | 0.1 | 0.1 | 0.1 ppt | 1 ppt | 0.02 ppt | 0.02 ppt |
| Example 11 | 30% | 0.1 | 0.1 | 1 ppb | 1 ppt | 234 ppt | 100 ppt |
| Example 12 | 30% | 0.1 | 0.1 | 10 ppt | 0.01 ppt | 1.21 ppt | 1 ppt |
| Example 13 | 30% | 0.1 | 0.1 | 10 ppt | 1 ppb | 701.2 ppt | 1 ppt |
| Example 14 | 45% | 0.1 | 0.1 | 10 ppt | 1 ppt | 2.2 ppt | 1 ppt |
| Example 15 | 60% | 0.1 | 0.1 | 10 ppt | 1 ppt | 2.2 ppt | 1 ppt |
| Example 16 | 30% | 0.1 | 0.1 | 10 ppt | 1 ppt | 2.2 ppt | 1 ppt |
| Example 17 | 30% | 0.1 | 0.1 | 5 ppt | 0.5 ppt | 1 ppt | 0.6 ppt |
| Example 18 | 30% | 0.1 | 0.1 | 100 ppt | 10 ppt | 20 ppt | 10 ppt |
| Example 19 | 30% | 0.1 | 0.1 | 1000 ppt | 100 ppt | 234 ppt | 100 ppt |
| Example 20 | 30% | 0.1 | 0.1 | 0.1 ppt | 0.02 ppt | 0.02 ppt | 0.02 ppt |
| Example 21 | 30% | 0.1 | 0.01 | 10 ppt | 1 ppt | 0.4 ppt | 1 ppt |
| Example 22 | 30% | 0.1 | 0.1 | 3000 ppt | 300 ppt | 234 ppt | 100 ppt |
| Example 23 | 30% | 0.1 | 0.1 | 5000 ppt | 5000 ppt | 0.02 ppt | 0.02 ppt |
| Comparative Example 1 | 30% | 0.1 | 10000 | 10 ppt | 1 ppt | 2.2 ppt | 1 ppt |
| Comparative Example 2 | 30% | 0.1 | 0.1 | 1 ppm | 15 ppb | 247 ppb | 100 ppb |

| | Hydrogen peroxide composition | | | | | Evaluation | | |
|---|---|---|---|---|---|---|---|---|
| | (E) | | | (F) | | | | |
| | Al component (by mass) | Ni component (by mass) | Pd component (by mass) | Water (% by mass) | (D)/(C) (mass ratio) | Storage stability | Oxidizing power | Defect performance |
| Example 1 | 1.2 ppt | 1 ppt | 1 ppt | Balance | $10^{\wedge}(-1)$ | B | B | A |
| Example 2 | 1.1 ppt | 0.9 ppt | 1 ppt | Balance | $10^{\wedge}(-1)$ | B | B | C |
| Example 3 | 1.2 ppt | 1.1 ppt | 1 ppt | Balance | $10^{\wedge}(-1)$ | B | B | B |
| Example 4 | 1 ppt | 1.2 ppt | 1.1 ppt | Balance | $10^{\wedge}(-1)$ | B | B | B |

TABLE 1-continued

| | | | | | | | | |
|---|---|---|---|---|---|---|---|---|
| Example 5 | 1 ppt | 1 ppt | 1 ppt | Balance | 10^(−1) | B | B | C |
| Example 6 | 0.8 ppt | 0.9 ppt | 1 ppt | Balance | 10^1 | C | B | B |
| Example 7 | 1.1 ppt | 0.8 ppt | 1.1 ppt | Balance | 10^0 | B | B | B |
| Example 8 | 1 ppt | 1 ppt | 1 ppt | Balance | 10^(−5) | B | B | B |
| Example 9 | 0.02 ppt | 0.02 ppt | 0.02 ppt | Balance | 10^(−4) | A | C | C |
| Example 10 | 0.02 ppt | 0.02 ppt | 0.02 ppt | Balance | 10^(−3) | A | B | A |
| Example 11 | 80 ppt | 105 ppt | 100 ppt | Balance | 10^1 | C | B | B |
| Example 12 | 1 ppt | 1 ppt | 1 ppt | Balance | 10^(−1) | B | B | A |
| Example 13 | 0.8 ppt | 0.8 ppt | 1 ppt | Balance | 10^(−1) | B | B | C |
| Example 14 | 0.8 ppt | 1 ppt | 1 ppt | Balance | 10^(−1) | B | B | A |
| Example 15 | 1 ppt | 1 ppt | 1.1 ppt | Balance | 10^(−1) | B | B | A |
| Example 16 | 1 ppt | 1 ppt | 1 ppt | Balance | 10^(−1) | B | B | A |
| Example 17 | 0.5 ppt | 0.5 ppt | 0.5 ppt | Balance | 5*10^(−2) | B | B | A |
| Example 18 | 8 ppt | 10.5 ppt | 10 ppt | Balance | 10^0 | B | B | B |
| Example 19 | 80 ppt | 105 ppt | 100 ppt | Balance | 10^1 | C | B | B |
| Example 20 | 0.02 ppt | 0.02 ppt | 0.02 ppt | Balance | 10^(−3) | A | B | A |
| Example 21 | 0.8 ppt | 1 ppt | 1 ppt | Balance | 10^0 | B | B | B |
| Example 22 | 80 ppt | 105 ppt | 100 ppt | Balance | 3*10^1 | D | B | B |
| Example 23 | 0.02 ppt | 0.02 ppt | 0.02 ppt | Balance | 5*10^1 | D | B | C |
| Comparative Example 1 | 1 ppt | 1 ppt | 1 ppt | Balance | 10^(−6) | C | B | D |
| Comparative Example 2 | 85 ppb | 115 ppb | 107 ppb | Balance | 10^4 | E | A | E |

TABLE 2

| | (E) Composition of metal component (by mass) | | | | | | |
|---|---|---|---|---|---|---|---|
| | Metal ion | | | | | | |
| | Fe | Pt | Ti | Cr | Al | Ni | Pd |
| Example 1 | 9 ppt | 0.7 ppt | 1.2 ppt | 0.5 ppt | 1.0 ppt | 0.8 ppt | 0.9 ppt |
| Example 2 | 5 ppt | 0.5 ppt | 1.0 ppt | 0.6 ppt | 0.8 ppt | 0.7 ppt | 0.9 ppt |
| Example 3 | 5 ppt | 0.7 ppt | 1.1 ppt | 0.7 ppt | 0.9 ppt | 0.8 ppt | 0.9 ppt |
| Example 4 | 2 ppt | 0.8 ppt | 1.8 ppt | 0.5 ppt | 0.8 ppt | 1.0 ppt | 1.0 ppt |
| Example 5 | 2 ppt | 0.7 ppt | 2.4 ppt | 0.5 ppt | 0.8 ppt | 0.8 ppt | 0.9 ppt |
| Example 6 | 6 ppt | 0.8 ppt | 1.2 ppt | 0.8 ppt | 0.6 ppt | 0.8 ppt | 0.9 ppt |
| Example 7 | 8 ppt | 0.7 ppt | 1.2 ppt | 0.5 ppt | 0.8 ppt | 0.7 ppt | 1.0 ppt |
| Example 8 | 3 ppt | 0.7 ppt | 1.2 ppt | 0.5 ppt | 0.8 ppt | 0.8 ppt | 0.9 ppt |
| Example 9 | 0 ppt | 0.99 ppt | 0.01 ppt | 0.01 ppt | 0.01 ppt | 0.01 ppt | 0.01 ppt |
| Example 10 | 0.09 ppt | 0.99 ppt | 0.01 ppt | 0.01 ppt | 0.01 ppt | 0.01 ppt | 0.01 ppt |
| Example 11 | 902 ppt | 0.7 ppt | 145 ppt | 50 ppt | 60 ppt | 80 ppt | 90 ppt |
| Example 12 | 9 ppt | 0 ppt | 1.2 ppt | 0.5 ppt | 0.8 ppt | 0.8 ppt | 0.9 ppt |
| Example 13 | 9 ppt | 999.8 ppt | 1.2 ppt | 0.5 ppt | 0.6 ppt | 0.7 ppt | 0.9 ppt |
| Example 14 | 9 ppt | 0.8 ppt | 1.2 ppt | 0.5 ppt | 0.6 ppt | 0.8 ppt | 0.9 ppt |
| Example 15 | 9 ppt | 0.7 ppt | 1.2 ppt | 0.5 ppt | 0.8 ppt | 0.8 ppt | 1.0 ppt |
| Example 16 | 9 ppt | 0.7 ppt | 1.2 ppt | 0.5 ppt | 0.8 ppt | 0.8 ppt | 0.9 ppt |
| Example 17 | 4 ppt | 0.35 ppt | 0.6 ppt | 0.3 ppt | 0.4 ppt | 0.4 ppt | 0.45 ppt |
| Example 18 | 99 ppt | 7 ppt | 13 ppt | 5 ppt | 6 ppt | 8 ppt | 9 ppt |
| Example 19 | 999 ppt | 70 ppt | 145 ppt | 50 ppt | 60 ppt | 80 ppt | 90 ppt |
| Example 20 | 0.07 ppt | 0.01 ppt | 0.01 ppt | 0.01 ppt | 0.01 ppt | 0.01 ppt | 0.01 ppt |
| Example 21 | 9 ppt | 0.7 ppt | 0.2 ppt | 0.5 ppt | 0.6 ppt | 0.75 ppt | 0.9 ppt |
| Example 22 | 2999 ppt | 270 ppt | 145 ppt | 50 ppt | 60 ppt | 80 ppt | 90 ppt |
| Example 23 | 4999 ppt | 4999.99 ppt | 0.01 ppt | 0.01 ppt | 0.01 ppt | 0.01 ppt | 0.01 ppt |
| Comparative Example 1 | 1 ppt | 0.7 ppt | 1.2 ppt | 0.5 ppt | 0.8 ppt | 0.8 ppt | 0.9 ppt |
| Comparative Example 2 | >10 ppb | 8 ppb | 145 ppb | 50 ppb | 60 ppb | 80 ppb | 90 ppb |

| | (E) Composition of metal component (by mass) | | | | | | |
|---|---|---|---|---|---|---|---|
| | Metal particle (non-ionic metal) | | | | | | |
| | Fe | Pt | Ti | Cr | Al | Ni | Pd |
| Example 1 | 1 ppt | 0.3 ppt | 1 ppt | 0.5 ppt | 0.2 ppt | 0.2 ppt | 0.1 ppt |
| Example 2 | 5 ppt | 0.5 ppt | 1 ppt | 0.5 ppt | 0.3 ppt | 0.2 ppt | 0.1 ppt |
| Example 3 | 5 ppt | 0.3 ppt | 1 ppt | 0.5 ppt | 0.3 ppt | 0.3 ppt | 0.1 ppt |
| Example 4 | 8 ppt | 0.2 ppt | 1 ppt | 0.5 ppt | 0.2 ppt | 0.2 ppt | 0.1 ppt |
| Example 5 | 8 ppt | 0.3 ppt | 1 ppt | 0.6 ppt | 0.2 ppt | 0.2 ppt | 0.1 ppt |
| Example 6 | 4 ppt | 0.2 ppt | 1 ppt | 0.7 ppt | 0.2 ppt | 0.1 ppt | 0.1 ppt |
| Example 7 | 2 ppt | 0.3 ppt | 1 ppt | 0.5 ppt | 0.3 ppt | 0.1 ppt | 0.1 ppt |
| Example 8 | 7 ppt | 0.3 ppt | 1 ppt | 0.5 ppt | 0.2 ppt | 0.2 ppt | 0.1 ppt |
| Example 9 | 0.01 ppt | 0.01 ppt | 0.01 ppt | 0.01 ppt | 0.01 ppt | 0.01 ppt | 0.01 ppt |
| Example 10 | 0.01 ppt | 0.01 ppt | 0.01 ppt | 0.01 ppt | 0.01 ppt | 0.01 ppt | 0.01 ppt |
| Example 11 | 98 ppt | 0.3 ppt | 89 ppt | 50 ppt | 20 ppt | 25 ppt | 10 ppt |

TABLE 2-continued

| | | | | | | | |
|---|---|---|---|---|---|---|---|
| Example 12 | 1 ppt | 0.01 ppt | 0.01 ppt | 0.5 ppt | 0.2 ppt | 0.2 ppt | 0.1 ppt |
| Example 13 | 1 ppt | 0.2 ppt | 700 ppt | 0.5 ppt | 0.2 ppt | 0.1 ppt | 0.1 ppt |
| Example 14 | 1 ppt | 0.2 ppt | 1 ppt | 0.5 ppt | 0.2 ppt | 0.2 ppt | 0.1 ppt |
| Example 15 | 1 ppt | 0.3 ppt | 1 ppt | 0.5 ppt | 0 2 ppt | 0.2 ppt | 0.1 ppt |
| Example 16 | 1 ppt | 0.3 ppt | 1 ppt | 0.5 ppt | 0.2 ppt | 0.2 ppt | 0.1 ppt |
| Example 17 | 1 ppt | 0.15 ppt | 0.4 ppt | 0.3 ppt | 0.1 ppt | 0.1 ppt | 0.05 ppt |
| Example 18 | 1 ppt | 3 ppt | 7 ppt | 5 ppt | 2 ppt | 2.5 ppt | 1 ppt |
| Example 19 | 1 ppt | 30 ppt | 89 ppt | 50 ppt | 20 ppt | 25 ppt | 10 ppt |
| Example 20 | 0.03 ppt | 0.01 ppt | 0.01 ppt | 0.01 ppt | 0.01 ppt | 0.01 ppt | 0.01 ppt |
| Example 21 | 1 ppt | 0.3 ppt | 0.2 ppt | 0.5 ppt | 0.2 ppt | 0.25 ppt | 0.1 ppt |
| Example 22 | 1 ppt | 30 ppt | 89 ppt | 50 ppt | 20 ppt | 25 ppt | 10 ppt |
| Example 23 | 1 ppt | 0.01 ppt | 0.01 ppt | 0.01 ppt | 0.01 ppt | 0.01 ppt | 0.01 ppt |
| Comparative Example 1 | 9 ppt | 0.3 ppt | 1 ppt | 0.5 ppt | 0.2 ppt | 0.2 ppt | 0.1 ppt |
| Comparative Example 2 | >10000 ppt | 7 ppb | 102 ppb | 50 ppb | 25 ppb | 35 ppb | 17 ppb |

From the results shown in Table 1, it was confirmed that, according to the hydrogen peroxide composition of Examples, the storage stability is excellent and the effect of defects on the semiconductor substrate is small in the case of being applied to a semiconductor device manufacturing process.

Further, from the comparison of Example 1, Examples 9, 10, 11 and Comparative Example 2, it was confirmed that, in the case where the content of the Fe component is 0.1 ppt by mass to 1 ppb by mass (preferably 0.1 ppt by mass to 800 ppt by mass, and more preferably 0.1 ppt by mass to 500 ppt by mass) with respect to the total mass of the composition, it is possible to achieve an excellent level of effects of both excellent storage stability and reduced effect of defects on the semiconductor substrate in the case of being applied to a semiconductor device manufacturing process, and further the oxidizing power is excellent.

Further, from the comparison of Example 1, Examples 6, 7, 8 and Comparative Example 1, it was confirmed that, in the case where the content of the acid is 0.01 ppb by mass to 1000 ppb by mass (preferably 0.05 ppb by mass to 800 ppb by mass, and more preferably 0.05 ppb by mass to 500 ppb by mass) with respect to the total mass of the composition, it is possible to achieve an excellent level of effects of both excellent storage stability and reduced effect of defects on the semiconductor substrate in the case of being applied to a semiconductor device manufacturing process.

Further, from the comparison of Example 1 and Examples 2 to 5, in the case of containing an anthraquinone compound, it was further confirmed that, in the case where the content of the anthraquinone compound is 0.01 ppb by mass to 1000 ppb by mass (preferably 0.05 ppb by mass to 800 ppb by mass, and more preferably 0.05 ppb by mass to 500 ppb by mass) with respect to the total mass of the composition, the effect of defects on the semiconductor substrate is small in the case of being applied to a semiconductor device manufacturing process.

Further, from the comparison of Example 1, Example 12, and Example 13, in the case where a metal component containing a specific atom selected from the group consisting of Ni, Pt, Pd, Cr, Ti, and Al is contained, it was further confirmed that, in the case where the content of the metal component is 0.01 ppt by mass to 1 ppb by mass (preferably 0.01 ppt by mass to 800 ppt by mass, and more preferably 0.01 ppt by mass to 500 ppt by mass) with respect to the total amount of the composition for each specific atom, the effect of defects on the semiconductor substrate is small in the case of being applied to a semiconductor device manufacturing process.

From the results of Examples, it was confirmed that, in the case where the content of the Fe component is $10^{-3}$ to $10^{-1}$ in terms of mass ratio with respect to the content of the acid, the storage stability is excellent, the effect of defects on the semiconductor substrate is small in the case of being applied to a semiconductor device manufacturing process, and further the oxidizing power is excellent.

In addition, from the results of Examples, in the case where the metal component containing a specific metal atom selected from the group consisting of Ni atom, Pt atom, Pd atom, Cr atom, Ti atom, and Al atom contains metal particles, it was further confirmed that, in the case where the content of the metal particles is each independently 0.01 ppt by mass to 500 ppt by mass (preferably 0.01 ppt by mass to 100 ppt by mass, and more preferably 0.01 ppt by mass to 50 ppt by mass) with respect to the total amount of the composition, there is a reduced effect of defects on the semiconductor substrate in the case of being applied to a semiconductor device manufacturing process.

On the other hand, the hydrogen peroxide compositions of Comparative Examples exhibited the results that the storage stability and the effect of defects on the semiconductor substrate were incompatible.

Examples A1 to A3

The hydrogen peroxide composition of Example 1 was placed in a storage container whose region in contact with the hydrogen peroxide composition is formed of the component of Table 3 below and stored at 25° C. for 1 month, followed by SNP-ICP-MS measurement and defect performance evaluation. SNP-ICP-MS and defect performance evaluation and measurement method are the same as in Example 1. The results are shown in Table 3. The concentration of each metal component shown in the columns of Examples A1 to A3 in Table 3 below means the concentration after storage. In addition, in Table 3, the measurement target in "SNP-ICP-MS" is Fe particles.

The contact angle with the container was measured with a contact angle meter DM-901 (manufactured by Kyowa Interface Science Co., Ltd.).

In the table, PFA represents a tetrafluoroethylene-perfluoroalkyl vinyl ether copolymer, and PTFE represents polytetrafluoroethylene.

TABLE 3

|  | Storage container | (D) Fe (by mass) | (E) Pt (by mass) | (F) Water | Contact angle with container (°) | SNP-ICP-MS (Fe particles) (ppt by mass) | Defect performance |
|---|---|---|---|---|---|---|---|
| Example 1 | Before storage | 10 ppt | 1 ppt | Balance | — | 1 | A |
| Example A1 | SUS316 | 25 ppt | 1 ppt | Balance | 70 | 10 | B |
| Example A2 | PFA | 11 ppt | 1 ppt | Balance | 95 | 1 | A |
| Example A3 | PTFE | 10 ppt | 1 ppt | Balance | 105 | 1 | A |

From the results shown in Table 3, it was confirmed that, by storing a hydrogen peroxide composition in a storage container whose region in contact with the hydrogen peroxide composition is formed of a material containing nonmetal as a main component, the defect performance is excellent even after long-term storage.

Examples B1 to B7

Hydrogen peroxide water (in Examples B1 to B7, the hydrogen peroxide composition of Example 1 was used. In Examples B5, B6 and B7, the hydrogen peroxide composition in which only the concentration of hydrogen peroxide in the hydrogen peroxide composition of Example 1 was changed to the hydrogen peroxide concentration (% by mass) described in Table 4 was used) and sulfuric acid water (sulfuric acid concentration (% by mass): listed in Table 4) were mixed at a mixing ratio (mass ratio) shown in Table 4, and the mixture was subjected to a resist peeling test under the conditions shown in Table 4 below. The resist to be tested is shown below.

(Resist Peeling Test)

Test wafer: PMER P-CA 1000 PM (positive tone resist manufactured by TOK Co., Ltd.) having a thickness of 10 μm was formed on a silicon wafer and the peeling ability for this resist layer was evaluated under the following conditions.

Chemical liquid volume: 200 ml.

Wafer size: 3 cm×3 cm

Treatment method: wafer is immersed in chemical liquid

Treatment time: 1 min.

In Table 4, with respect to Examples B1 to B4, the sulfuric acid water was heated to 90° C. in advance and then mixed with the hydrogen peroxide composition. With respect to Examples B5 to B7, the sulfuric acid water was heated to 65° C. in advance and then mixed with the hydrogen peroxide composition. In each of Examples, after mixing the hydrogen peroxide composition and sulfuric acid water, heating was further carried out until the "treatment temperature" was reached, and then the mixed composition was used for a resist peeling test.

The resist peelability was determined based on the following evaluation standards.

"A": Resist removability of 100% was visually observed.

"B": Resist removability of 90% or more to less than 100% was visually observed.

"C": Resist removability of less than 90% was visually observed.

TABLE 4

|  | Hydrogen peroxide water | Sulfuric acid water | Mixing ratio | Treatment temperature (° C.) | Resist peelability |
|---|---|---|---|---|---|
| Example B1 | 30% | 98% | 1:1 | >150 | A |
| Example B2 | 30% | 98% | 2:1 | >150 | A |
| Example B3 | 30% | 98% | 3:1 | >150 | A |
| Example B4 | 30% | 98% | 1:1 | >100 | A |
| Example B5 | 15% | 50% | 1:1 | 60 | B |
| Example B6 | 10% | 50% | 1:1 | 60 | C |
| Example B7 | 3% | 50% | 1:1 | 60 | C |

From the results shown in Table 4, it was confirmed that the hydrogen peroxide composition of the present invention can be preferably applied to the SPM treatment.

Examples C1 to C5 and Comparative Example 3

Hydrogen peroxide water (in Examples C1 to C3, the hydrogen peroxide composition of Example 1 was used. In Examples C4 and C5, the hydrogen peroxide composition in which only the concentration of hydrogen peroxide in the hydrogen peroxide composition of Example 1 was changed to the hydrogen peroxide concentration (% by mass) described in Table 5 was used) and ammonia water (ammonia concentration (% by mass): listed in Table 5) were mixed at a mixing ratio (mass ratio) shown in Table 5, and the mixture was subjected to a particle removal test on a Si substrate under the following conditions. The ammonia water used in the present Example is high-purity ammonia water which has been confirmed that the total metal concentration is 10 ppt by mass or less. The hydrogen peroxide composition used in Comparative Example 3 is the hydrogen peroxide composition of Comparative Example 2 in Table 1.

In each of Examples, after mixing the hydrogen peroxide composition and ammonia water, heating was carried out until the "treatment temperature" was reached, and then the mixed composition was used for a particle removal treatment.

Particle Removal Test

Each chemical liquid was coated on a tetraethyl orthosilicate (TEOS) substrate, and then the number of defects before and after treatment was counted in the measurement mode of the bright field of UVison5 (manufactured by Applied Materials, Inc.). Within this count, defect classification evaluation EDAX (elemental analysis) was carried out, and the number of defects containing Si was taken as total particles. In addition, the total number of particles on the TEOS substrate before measurement was 200.

The particle removability was determined based on the following evaluation standards.

"A": The total number of particles is 50 or less

"B": The total number of particles is more than 50 to 100 or less

"C": The total number of particles is more than 100 to 200 or less

"D": The total number of particles is more than 200

TABLE 5

|  | Hydrogen peroxide water | Ammonia water | Mixing ratio | Treatment temperature (° C.) | Particle removability |
|---|---|---|---|---|---|
| Example C1 | 30% | 30% | 1:1 | 60 | A |
| Example C2 | 30% | 30% | 2:1 | 60 | A |
| Example C3 | 30% | 30% | 3:1 | 60 | A |
| Example C4 | 10% | 10% | 1:1 | 45 | B |
| Example C5 | 3% | 3% | 1:1 | 35 | C |
| Comparative Example 3 | 30% | 30% | 1:1 | 60 | D |

From the results shown in Table 5, it was confirmed that the particle removability was excellent in the case where the SC-1 treatment was carried out using the hydrogen peroxide composition of the present invention.

Examples D1 to D6 and Comparative Example 4

Hydrogen peroxide water (in Examples D1 to D6, the hydrogen peroxide composition of Example 1 was used. In Examples D5 and D6, the hydrogen peroxide composition in which only the concentration of hydrogen peroxide in the hydrogen peroxide composition of Example 1 was changed to the hydrogen peroxide concentration (% by mass) described in Table 6 was used) and hydrochloric acid water (hydrochloric acid concentration (% by mass): listed in Table 6) were mixed at a mixing ratio (mass ratio) shown in Table 6, and the mixture was subjected to a metal removal test on a Si substrate under the following conditions.

The hydrochloric acid water used in the present Example is high-purity hydrochloric acid water which has been confirmed that the total metal concentration is 10 ppt by mass or less. The hydrogen peroxide composition used in Comparative Example 4 is the hydrogen peroxide composition of Comparative Example 2 in Table 1.

In each of Examples, after mixing the hydrogen peroxide composition and ammonia water, heating was carried out until the "treatment temperature" was reached, and then the mixed composition was used as a metal ion removal treatment liquid.

Metal Ion Removal Test

Each chemical liquid was coated on a TEOS substrate, and then the number of defects before and after treatment was counted in the measurement mode of the bright field of UVison5 (manufactured by Applied Materials, Inc.). Within this count, defect classification evaluation EDAX (elemental analysis) was carried out, and the number of defects containing metal atoms excluding Si was taken as the total number of metal ion components. The number of metal ion components on the TEOS substrate before measurement was 50.

The metal ion removability was determined based on the following evaluation standards.

"A": The number of metal ion components is 20 or less

"B": The number of metal ion components is more than 20 to 30 or less

"C": The number of metal ion components is more than 30 to 50 or less

"D": The number of metal ion components is more than 50

TABLE 6

|  | Hydrogen peroxide water | Hydrochloric acid water | Mixing ratio | Treatment temperature (° C.) | Metal ion removability |
|---|---|---|---|---|---|
| Example D1 | 30% | 37% | 1:1 | >150 | A |
| Example D2 | 30% | 37% | 2:1 | >150 | A |
| Example D3 | 30% | 37% | 3:1 | >150 | A |
| Example D4 | 30% | 37% | 1:1 | >100 | A |
| Example D5 | 15% | 10% | 1:1 | 60 | B |
| Example D6 | 3% | 3% | 1:1 | 60 | C |
| Comparative Example 4 | 30% | 30% | 1:1 | 60 | D |

From the results shown in Table 6, it was confirmed that the metal ion removability was excellent in the case where the SC-2 treatment was carried out using the hydrogen peroxide composition of the present invention.

Examples E1 to E4

A filtration test shown in Table 7 below was carried out on the reference liquid (which is a pre-purification liquid corresponding to "Before treatment" in Table 7), whereby the total metal concentration of various metals (Fe component and Pt component) after filtration and the amount of Fe particles measured by SNP-ICP-MS were confirmed. The reference liquid was prepared by modifying the preparation method of a hydrogen peroxide composition of Example 1 so that the hydrogen peroxide composition having a composition of "Before treatment" shown in Table 7 below was obtained. In addition, in each of Examples, each composition described refers to a composition purified through the filtering step described in Table 7. That is, for example, in Example E1, the composition described means that the hydrogen peroxide composition before treatment was filtered with the nylon (pore diameter: 5 nm) described in Table 7, which thus refers to that the content of the (B) anthraquinone compound was purified to 0.1 ppb by mass, the concentration of (C) acid was purified to 0.1 ppb by mass, the concentration of (D) Fe component was purified to 31 ppt by mass, and the concentration of (E) Pt component was purified to 8 ppt by mass. The results are shown in Table 7.

TABLE 7

|  | (A) Hydrogen peroxide (% by mass) | (B) Anthraquinone compound (ppb by mass) | (C) Acid (ppb by mass) | (F) Water | Filter used First step | Filter used Second step | (D) Fe (by mass) | (E) Pt (by mass) | SNP-ICP-MS (Fe particles) (ppt by mass) |
|---|---|---|---|---|---|---|---|---|---|
| Before treatment | 30% | 0.3 | 0.2 | Balance | — | — | 84 ppt | 15 ppt | 12 |
| Example E1 | 30% | 0.1 | 0.1 | Balance | Nylon_5 nm | — | 31 ppt | 8 ppt | 5 |
| Example E2 | 30% | 0.1 | 0.1 | Balance | PFA_7 nm | — | 26 ppt | 5 ppt | 4 |
| Example E3 | 30% | 0.1 | 0.1 | Balance | PTFE_3 nm | — | 15 ppt | 3 ppt | 3 |
| Example E4 | 30% | 0.1 | 0.1 | Balance | PFA_7 nm | PTFE_3 nm | 10 ppt | 1 ppt | 1 |

From the results shown in Table 7, it was confirmed that the amount of the metal component can be efficiently reduced by using a filter formed of a fluorine-based resin such as PTFE or PTA.

EXPLANATION OF REFERENCES 100, 200: manufacturing apparatus
101: tank
102: supply port
103, 106, 107: valve
104: pump
105: filtration device
108: container
109: supply pipe line
110: circulation pipe line
111: discharge unit
112: cleaning liquid monitoring unit
113: pipe line
201: distillation column
202, 203, 204: pipe line
205, 206, 207: valve

What is claimed is:

1. A composition, comprising:
hydrogen peroxide;
an inorganic phosphoric acid;
a Fe component, and
an anthraquinone compound,
wherein the content of the Fe component is $5 \times 10^{-2}$ to $10^2$ in terms of mass ratio with respect to the content of the phosphoric acid.

2. The composition according to claim 1, further comprising:
at least one or more metal components containing a specific atom selected from the group consisting of Pt and Pd,
wherein the content of the metal component is 0.01 ppt by mass to 1 ppb by mass with respect to the total mass of the composition.

3. The composition according to claim 1, wherein the content of the anthraquinone compound is 0.01 ppb by mass to 1000 ppb by mass with respect to the total mass of the composition.

4. The composition according to claim 1, wherein the content of the phosphoric acid is 0.01 ppb by mass to 1000 ppb by mass with respect to the total mass of the composition.

5. The composition according to claim 1, wherein the total content of the Fe component is 0.1 ppt by mass to 1 ppb by mass with respect to the total mass of the composition.

6. The composition according to claim 1, wherein the content of Fe particles contained in the Fe component is 0.01 ppt by mass to 0.1 ppb by mass with respect to the total mass of the composition.

7. The composition according to claim 1, further comprising:
at least one or more metal components containing a specific atom selected from the group consisting of Ni, Pt, Pd, Cr, Ti, and Al,
wherein the content of the metal component is 0.01 ppt by mass to 10 ppb by mass with respect to the total mass of the composition for each specific atom.

8. The composition according to claim 1, further comprising:
at least one or more metal components containing a specific atom selected from the group consisting of Ni, Pt, Pd, and Al,
wherein the content of the metal component is 0.01 ppt by mass to 1 ppb by mass with respect to the total mass of the composition.

9. The composition according to claim 1, wherein the anthraquinone compound is at least one or more selected from the group consisting of alkyl anthraquinone and alkyl tetrahydroanthraquinone.

10. The composition according to claim 9, wherein the alkyl anthraquinone is ethyl anthraquinone or amyl anthraquinone, and the alkyl tetrahydroanthraquinone is ethyl tetrahydroanthraquinone or amyl tetrahydroanthraquinone.

11. The composition according to claim 1, which is used as a treatment liquid for a semiconductor substrate.

12. A composition reservoir, comprising:
a storage container; and
the composition according to claim 1 contained in the storage container,
wherein a region of the storage container in contact with the composition is formed of a material containing nonmetal as a main component.

13. The composition reservoir according to claim 12, wherein the material containing nonmetal as a main component is any one selected from the group consisting of high density polyethylene, tetrafluoroethylene-perfluoroalkyl vinyl ether copolymer, and polytetrafluoroethylene.

14. The composition reservoir according to claim 12, wherein a contact angle between the material containing nonmetal as a main component and water is 60 to 120°.

15. A method for producing the composition according to claim 1, comprising:
a raw material purification step of purifying any one or more selected from a solvent and a raw material component including an anthraquinone compound;
a hydrogen peroxide synthesis step of reducing the anthraquinone compound in the presence of a catalyst to synthesize an anthrahydroquinone compound and oxidizing the anthrahydroquinone compound to synthesize hydrogen peroxide;
a hydrogen peroxide separation step of extracting the obtained hydrogen peroxide to take out the hydrogen peroxide from a reaction system; and
a hydrogen peroxide composition purification step of further purifying a hydrogen peroxide composition containing the hydrogen peroxide separated from the reaction system.

16. A composition, comprising:
hydrogen peroxide;
a phosphoric acid which is inorganic acid;
a Fe component, and
an anthraquinone compound,
wherein the content of the Fe component is $10^{-5}$ to $10^2$ in terms of mass ratio with respect to the content of the phosphoric acid, and
the content of the phosphoric acid is 0.01 ppb by mass to 1000 ppb by mass with respect to the total mass of the composition.

17. The composition according to claim 16, further comprising:
at least one or more metal components containing a specific atom selected from the group consisting of Pt and Pd,
wherein the content of the metal component is 0.01 ppt by mass to 1 ppb by mass with respect to the total mass of the composition.

18. The composition according to claim 16, wherein the content of the anthraquinone compound is 0.01 ppb by mass to 1000 ppb by mass with respect to the total mass of the composition.

19. The composition according to claim 16, wherein the total content of the Fe component is 0.1 ppt by mass to 1 ppb by mass with respect to the total mass of the composition.

20. The composition according to claim 16, wherein the content of Fe particles contained in the Fe component is 0.01 ppt by mass to 0.1 ppb by mass with respect to the total mass of the composition.

21. The composition according to claim 16, further comprising:
at least one or more metal components containing a specific atom selected from the group consisting of Ni, Pt, Pd, Cr, Ti, and Al,
wherein the content of the metal component is 0.01 ppt by mass to 10 ppb by mass with respect to the total mass of the composition for each specific atom.

22. The composition according to claim 16, further comprising:
at least one or more metal components containing a specific atom selected from the group consisting of Ni, Pt, Pd, and Al,
wherein the content of the metal component is 0.01 ppt by mass to 1 ppb by mass with respect to the total mass of the composition.

23. The composition according to claim 16, wherein the anthraquinone compound is at least one or more selected from the group consisting of alkyl anthraquinone and alkyl tetrahydroanthraquinone.

24. The composition according to claim 23, wherein the alkyl anthraquinone is ethyl anthraquinone or amyl anthraquinone, and the alkyl tetrahydroanthraquinone is ethyl tetrahydroanthraquinone or amyl tetrahydroanthraquinone.

25. The composition according to claim 16, which is used as a treatment liquid for a semiconductor substrate.

\* \* \* \* \*